(12) United States Patent
Shimizu et al.

(10) Patent No.: US 8,369,801 B2
(45) Date of Patent: Feb. 5, 2013

(54) MULTIMODE-COMPATIBLE POLAR MODULATION TRANSMISSION DEVICE AND MULTIMODE RADIO COMMUNICATION METHOD

(75) Inventors: Yoshito Shimizu, Kanagawa (JP); Akihiko Matsuoka, Kanagawa (JP); Tomoya Urushihara, Chiba (JP)

(73) Assignee: Panasonic Corporation, Osaka (JP)

( * ) Notice: Subject to any disclaimer, the term of this patent is extended or adjusted under 35 U.S.C. 154(b) by 1256 days.

(21) Appl. No.: 12/159,121

(22) PCT Filed: Dec. 26, 2006

(86) PCT No.: PCT/JP2006/325955
§ 371 (c)(1),
(2), (4) Date: Jun. 25, 2008

(87) PCT Pub. No.: WO2007/074839
PCT Pub. Date: Jul. 5, 2007

(65) Prior Publication Data
US 2010/0291885 A1    Nov. 18, 2010

(30) Foreign Application Priority Data

Dec. 27, 2005  (JP) .................................. 2005-375485

(51) Int. Cl.
| H04B 1/66 | (2006.01) |
| H04B 17/00 | (2006.01) |
| H04B 1/04 | (2006.01) |
| H03C 3/00 | (2006.01) |

(52) U.S. Cl. .......... 455/91; 455/102; 455/108; 455/110; 455/115.1; 455/127.4

(58) Field of Classification Search .................. 455/102, 455/108–113, 114.2–114.3, 126–127.4, 91, 455/115.1–115.2; 375/295–300
See application file for complete search history.

(56) References Cited

U.S. PATENT DOCUMENTS
(Continued)

FOREIGN PATENT DOCUMENTS
| JP | 2003-318999 | 7/2003 |
| JP | 2004-501527 | 1/2004 |

(Continued)

OTHER PUBLICATIONS

Kenington; "High Linearity RF Amplifier Design"; Artech House Publishers.

(Continued)

*Primary Examiner* — Simon Nguyen
(74) *Attorney, Agent, or Firm* — Pearne & Gordon LLP

(57) ABSTRACT

An object of the invention is to provide a multimode polar modulation device and a multimode radio communication method for making it possible to decrease the distortion compensation processing data capacity while maintaining the distortion compensation accuracy and also making it possible to efficiently store the distortion compensation processing data corresponding to a multimode modulation signal adaptively acquired in memory.

At the distortion compensation coefficient calibration operation time of a polar modulation circuit 1901, a control section 1903 selects a modulation signal with a narrower dynamic range of amplitude signal than at the transmission operation time, an adaptive operation control section 1711 measures a spectrum in output of a power amplifier 1 for each predetermined output level, and a distortion compensation processing circuit 1701 finds optimum coefficient information. On the other hand, at the transmission operation time, the optimum coefficient information found according to the above-mentioned procedure is referenced and the optimum coefficient information of a modulation signal with a wide dynamic range of amplitude signal is found.

16 Claims, 20 Drawing Sheets

U.S. PATENT DOCUMENTS

| | | | |
|---|---|---|---|
| 6,366,177 B1 | 4/2002 | McCune et al. | |
| 6,697,436 B1 * | 2/2004 | Wright et al. | 375/296 |
| 7,043,213 B2 * | 5/2006 | Robinson et al. | 455/127.2 |
| 7,474,708 B1 * | 1/2009 | Khlat et al. | 375/296 |
| 7,529,523 B1 * | 5/2009 | Young et al. | 455/115.1 |
| 7,532,679 B2 * | 5/2009 | Staszewski et al. | 375/295 |
| 7,539,462 B2 * | 5/2009 | Peckham et al. | 455/83 |
| 7,945,224 B2 * | 5/2011 | Sorrells et al. | 455/127.1 |
| 2004/0071225 A1 * | 4/2004 | Suzuki et al. | 375/297 |
| 2004/0198257 A1 * | 10/2004 | Takano et al. | 455/108 |
| 2004/0208157 A1 * | 10/2004 | Sander et al. | 370/345 |
| 2004/0219891 A1 * | 11/2004 | Hadjichristos | 455/102 |
| 2005/0110565 A1 * | 5/2005 | Robinson | 330/124 R |
| 2005/0153669 A1 * | 7/2005 | Suzuki et al. | 455/103 |
| 2005/0185727 A1 | 8/2005 | Tanaka et al. | |
| 2006/0159198 A1 | 7/2006 | Morimoto et al. | |
| 2006/0209986 A1 * | 9/2006 | Jensen et al. | 375/302 |

FOREIGN PATENT DOCUMENTS

| | | |
|---|---|---|
| JP | 2005-150814 | 6/2005 |
| JP | 2005-278162 | 10/2005 |
| JP | 2005-286995 | 10/2005 |
| JP | 2006-253749 | 9/2006 |
| JP | 2006-333450 | 12/2006 |
| WO | 2005-104352 | 3/2005 |
| WO | 2006-001433 | 1/2006 |

OTHER PUBLICATIONS

International Search Report Dated Feb. 6, 2007.

Kenington; "High Linearity RF Amplifier Design"; Artech House Publishers; 2000.

* cited by examiner

FIG. 5

| ADDRESS | coeff1 |
|---|---|
| 1 | $C_1$ |
| 2 | $C_2$ |
| 3 | $C_3$ |
| 4 | $C_4$ |
| ⋮ | ⋮ |
| N | $C_N$ |

FIG. 6

| OUTPUT POWER | TRANSMISSION LEVEL INFORMATION |
|---|---|
| 33 | 1 |
| 31 | 2 |
| 29 | 3 |
| 27 | 4 |
| ⋮ | ⋮ |
| 5 | 15 |

| ADDRESS | PCL |
|---------|-----|
| 1 | 1 |
| 2 | $PCL_2$ |
| ⋮ | ⋮ |
| M | $PCL_M$ |
| M+1 | $PCL_{M+1}$ |
| ⋮ | ⋮ |
| 15 | $PCL_{15}$ |

| D7 | D141 |
|---|---|
| r0~r1 | 1 |
| r1~r2 | 2 |
| r2~r3 | 3 |
| r3~r4 | 4 |
| ⋮ | ⋮ |
| r(K-1)~rK | K |

FIG. 20

| ADDRESS | coeff6 |
|---|---|
| 1 | $C_{211}$ |
| 2 | $C_{212}$ |
| 3 | $C_{213}$ |
| 4 | $C_{214}$ |
| ⋮ | ⋮ |
| n | $C_{21n}$ |

FIG. 21

| D7 | D141 |
|---|---|
| 1~PCL1B | 1 |
| PCL1B~PCL2B | 2 |
| PCL2B~PCL3B | 3 |
| PCL3B~PCL4B | 4 |
| ⋮ | ⋮ |
| PCL(k-1)B~PCLkB | k |

FIG. 26

| ADDRESS | coeff7 |
|---------|--------|
| 1 | $C_{261}$ |
| 2 | $C_{262}$ |
| 3 | 1 |
| 4 | $C_{264}$ |
| 5 | $C_{265}$ |
| ⋮ | ⋮ |

| MODULATION SPEED | $D_{251}$ |
|---|---|
| ~100k | 1 |
| ~200k | 2 |
| ~400k | 3 |
| ~800k | 4 |
| ~1.6M | 5 |
| ⋮ | ⋮ |

FIG. 31

| RADIO COMMUNICATION SYSTEM | FREQUENCY | MODULATION SYSTEM | MODULATION SPEED |
|---|---|---|---|
| FIRST RADIO COMMUNICATION SYSTEM 3011 | f1 | 8-PSK | SP1 |
| SECOND RADIO COMMUNICATION SYSTEM 3012 | f2 | QPSK | SP2 |
| THIRD RADIO COMMUNICATION SYSTEM 3013 | f3 | HPSK | SP3 |
| FOURTH RADIO COMMUNICATION SYSTEM 3014 | f3 | 8-PSK | SP4 |
| FIFTH RADIO COMMUNICATION SYSTEM 3015 | f1 | OFDM | SP5 |

MULTIMODE-COMPATIBLE POLAR MODULATION TRANSMISSION DEVICE AND MULTIMODE RADIO COMMUNICATION METHOD

TECHNICAL FIELD

This invention relates to a multimode polar modulation transmitter containing a distortion compensation processing circuit for compensating for distortion of an output signal of an amplifier compatible with a plurality of modulation systems and a multimode radio communication method for efficiently acquiring compensation data of the distortion compensation processing circuit.

BACKGROUND ART

In mobile telephone service of recent years, the demand for data communications has grown in addition to voice call and thus it is important to improve the communication speed. For example, in a GSM (Global System for Mobile communications) system put into widespread use mainly in European and Asian regions, hitherto, voice call has been conducted in GMSK modulation for shifting the phase of a carrier in response to transmission data; EDGE (Enhanced Data rates for GSM Evolution) system for also conducting data communications in 3π/8 rotating 8-PSK modulation (hereinafter, simply 8-PSK modulation) increasing bit information per symbol three times relative to the GMSK modulation by shifting the phase and the amplitude of a carrier in response to transmission data is proposed. A multimode terminal compatible with a plurality of radio systems such as mobile telephone systems of UMTS (Universal Mobile Telecommunications System), GSM, etc., and a wireless LAN (Local Area Network) appears. Further, research on software radio (SDR: Software Defined Radio) technology is also conducted as technology for realizing miniaturization and cost reduction of a radio terminal to cover various radio systems also containing radio systems other than the radio systems mentioned above.

In a linear modulation system involving amplitude fluctuation like the 8-PSK modulation, linearity requirement for a power amplifier of a transmission section of a radio communication device is strict. Generally, the power efficiency in a linear operation region of a power amplifier is lower as compared with that in a saturation operation region. Therefore, if a quadrature modulation system in a related art is applied to the linear modulation system, it is difficult to enhance the power efficiency.

Then, a system of realizing higher efficiency of a power amplifier in linear modulation system, called EER (Envelope Elimination & Restoration), by separating a transmission signal into a constant amplitude phase signal and an amplitude signal, performing phase modulation in a phase modulator based on the constant amplitude phase signal, inputting a constant amplitude phase modulation signal at a level at which the power amplifier performs a saturation operation, and driving a control voltage of the power amplifier at high speed to synthesize amplitude modulation is known (for example, refer to page 427, FIG. 7.1 of non-patent document 1). Particularly, a modulation system of separating a transmission signal in a baseband and performing modulation using a separated constant amplitude phase signal and amplitude signal is called Polar Modulation system (polar modulating system) (for example, refer to page 428, FIG. 7.2 of non-patent document 1). Hereinafter, it will be called polar modulation system to make it clear that a modulation system different from the quadrature modulation system in the related art will be discussed.

In the polar modulation system, in the present technology level, it is difficult to ensure the linearity of output signal amplitude for the input control voltage of a power amplifier for the required dynamic range (hereinafter, simply D-range) to represent an amplitude signal in power amplifier output and therefore it becomes necessary to apply distortion compensation processing technology.

FIG. 29 is a block diagram to show a polar modulation transmitter in a related art incorporating predistortion (hereinafter abbreviated as PD) distortion compensation processing technology described in FIG. 10 of patent document 1.

As shown in FIG. 29, a polar modulation transmitter 20 includes a power amplifier 1, a polar conversion section 2, a distortion compensation processing circuit 3, an amplitude modulation section 10, a phase modulation section 11, and an amplitude phase measurement section 12. The distortion compensation processing circuit 3 includes delay adjustment sections 4 and 5, memory 6, an address generation section 7, an amplitude correction section 8, and a phase correction section 9.

Next, the operation of the polar modulation transmitter 20 in the related art shown in FIG. 29 will be discussed.

To implement a radio communication device transmission section using the polar modulation transmitter 20, the polar conversion section 2 separates a baseband quadrature coordinate signal (IQ signal) input from a signal generation section not shown of a radio communication device into an amplitude signal r(t) and a constant-amplitude phase signal θ(t). Here, r(t) is normalized with a predetermined value.

The distortion compensation processing circuit 3 performs predetermined distortion compensation processing for the amplitude signal r(t) and the phase signal θ(t) and outputs the amplitude signal after subjected to amplitude correction to the amplitude modulation section 10 and also outputs the phase signal after subjected to phase correction to the phase modulation section 11. The configuration and the operation of the distortion compensation processing circuit 3 are described later.

The amplitude modulation section 10 drives the control voltage of the power amplifier 1 based on the amplitude signal output from the distortion compensation processing circuit 3.

The phase modulation section 11 executes phase modulation based on the phase signal output from the distortion compensation processing circuit 3.

The power amplifier 1 combines amplitude modulation with the phase modulation signal output from the phase modulation section 11 based on the output signal from the amplitude modulation section 10 as a control signal.

When a predetermined input signal is given to the polar conversion section 2 and the output signal amplitude of the power amplifier 1 is controlled by decreasing the control voltage at which the amplitude signal becomes a given value at predetermined intervals from the maximum value, the amplitude and phase measurement section 12 measures the output signal amplitude characteristic and the passage phase characteristic of the power amplifier 1 every control voltage value and outputs acquired data to the memory 6.

Next, the configuration and the operation of the distortion compensation processing circuit 3 will be discussed in detail.

To compensate for the delay between the paths of the amplitude modulation signal and the phase modulation signal, the delay adjustment sections 4 and 5 give a predetermined delay to the amplitude signal and the phase signal output from the polar conversion section 2 and output the amplitude signal after subjected to the delay adjustment to the address generation section 7 and the amplitude correction section 8 and also output the phase signal after subjected to the delay adjustment to the phase correction section 9.

The memory 6 stores the inverse characteristics of the output signal amplitude characteristic relative to the input control signal (AM-AM: Amplitude Modulation to Amplitude Modulation conversion, which will be hereinafter called AM-AM characteristic) and the passage phase characteristic (AM-PM: Amplitude Modulation to Phase Modulation conversion, which will be hereinafter called AM-PM characteristic), of the power amplifier 1 in a predetermined input high frequency signal amplitude, output from the amplitude and phase measurement section 12, and outputs an amplitude correction signal and a phase correction signal of the inverse characteristics of the power amplifier 1 in response to an address signal output from the address generation section 7. The above-mentioned characteristics indicate the characteristics when a control voltage in a steady state is supplied.

To distinguish the AM-AM characteristic and the AM-PM characteristic of the power amplifier 1 when a control voltage in a steady state is supplied, each of the inverse characteristics, and the characteristic of the power amplifier at the amplitude modulation operation time from each other, hereinafter the characteristic of the power amplifier 1 acquired using a measurement section of the amplitude and phase measurement section 12, etc., will be called forward characteristic (AM-AM forward characteristic, AM-PM forward characteristic), compensation data stored in distortion compensation processing memory of the memory 6, etc., will be called inverse characteristic (AM-AM inverse characteristic, AM-PM inverse characteristic), and the characteristic of the power amplifier 1 at the amplitude modulation operation time will be called dynamic characteristic (AM-AM dynamic characteristic, AM-PM dynamic characteristic).

The address generation section 7 converts the amplitude signal output from the delay adjustment section 4 into a discrete value having a predetermined range and a predetermined step width, found from the compensation data stored in the memory 6 and compensation accuracy and then generates an address signal to refer to the compensation data stored in the memory 6.

The amplitude correction section 8 makes a correction to the amplitude signal output from the delay adjustment section 4 based on the amplitude correction signal output from the memory 6.

The phase correction section 9 makes a correction to the phase signal output from the delay adjustment section 5 based on the phase correction signal output from the memory 6.

Thus, the amplitude modulation signal and the phase modulation signal previously distorted considering the inverse characteristics of the output characteristics of the power amplifier relative to the input control signal become desired output amplitude and phase by receiving the effect of actual amplitude, phase distortion occurring in the power amplifier, and the linearity relative to the input control voltage can be improved.

The operation description of the polar modulation transmitter in the related art described in patent document 1 is now complete. Hereinafter, the polar modulation transmitter 20 described in patent document 1 will be called the polar modulation transmitter in the related art.

Subsequently, the art required for implementing a multimode radio communication device transmission section using the polar modulation transmitter in the related art will be discussed.

To implement a multimode radio communication device transmission section using the polar modulation transmitter in the related art, distortion compensation processing corresponding to the modulation speed and the required D-range of an amplitude signal varying from one system to another to linearize the operation of a power amplifier.

Next, the art required for implementing a transmission section of an SDR communication device will be discussed.

The SDR communication device can be changed to any desired characteristic and function by rewriting software (reconfiguring) containing the computation processing function of a digital signal processing section, and can be compatible with various communication systems incompatible at the manufacturing time of the device, namely, multimode modulation signal. On the other hand, in the current state of the art, it is difficult to reconfigure an analog circuit of a power amplifier, etc., to change to any desired characteristic and function. Therefore, for example, to use the same power amplifier for multimode modulation signal, a compensation art for a characteristic changing in response to a modulation signal is required.

Patent document 1: International Patent Publication No. 2004-501527

Non-patent document 1: Kenington, Peter B, "High-Linearity RF Amplifier Design", Artech House Publishers

DISCLOSURE OF THE INVENTION

Problems to be Solved by the Invention

Problems occurring when a multimode radio communication device transmission section is implemented using the polar modulation transmitter in the related art will be discussed.

The multimode radio communication device needs to be compatible with multimode modulation signal to process a plurality of modulation signals for each covered system or even in the same system.

Patent document 1 does not disclose an efficient storage method of distortion compensation processing data when the modulation speed varies or when the required D-range of an amplitude signal varies. However, in the polar modulation transmitter in the related art, it is possible to previously store distortion compensation processing data for each multimode modulation signal to be compatible with and combine with an art for performing distortion compensation processing for a power amplifier.

However, if distortion compensation processing data is stored in memory for each multimode modulation signal, the memory capacity increases and a problem of an increase in the manufacturing cost of the radio communication device occurs.

Therefore, a first problem is to realize distortion compensation processing compatible with multimode modulation signal while decreasing the distortion compensation processing data capacity.

To implement an SDR communication device, it is necessary to previously store the distortion compensation processing data of a power amplifier in memory for each multimode modulation signal. However, previously storing the distortion compensation processing data for modulation signals incompatible at the manufacturing time of the device in memory involves an increase in the circuit scale and, for example, different distortion compensation processing data is necessary for a modulation signal different in modulation speed even if the modulation system is the same.

In the polar modulation transmitter in the related art, the amplitude and phase measurement section can be used to acquire the distortion compensation processing data of a power amplifier for each modulation signal, but the distortion compensation processing data acquired in the procedure described above leads to an increase in the memory capacity and the manufacturing cost of a radio communication device grows as described above.

Therefore, a second problem is to efficiently store the distortion compensation processing data compatible with multimode modulation signal, adaptively acquired in memory.

It is therefore an object of the invention to provide a multimode polar modulation device and a multimode radio communication method for making it possible to decrease the distortion compensation processing data capacity while maintaining the distortion compensation accuracy and also making it possible to efficiently store the distortion compensation processing data corresponding to a multimode modulation signal adaptively acquired in memory.

Means for Solving the Problems

A multimode polar modulation transmitter of the invention, first, includes a first control section for switching a modulation system of a transmission modulation signal; a signal generation section for generating a baseband quadrature signal according to the modulation system selected by the first control section based on transmission data; a polar conversion section for generating an amplitude signal from the baseband quadrature signal; an amplitude modulation section for generating an amplitude modulation signal based on the amplitude signal; a phase modulation section for generating a phase modulation signal in a radio frequency band based on a signal containing at least a phase component of the baseband quadrature signal; an amplification section for inputting the phase modulation signal as an input high frequency signal, inputting the amplitude modulation signal as a control signal, and generating transmission data in the radio frequency band; a distortion compensation processing circuit for performing predetermined distortion compensation processing for at least one of the input signal to the amplitude modulation section and the input signal to the phase modulation section; and a second control section for switching between calibration operation of compensation data used in the distortion compensation processing circuit and transmission operation, and at the calibration operation time, the first control section selects a modulation system becoming equal to or less than the amplitude dynamic range of a modulation signal in the modulation system used at the transmission operation time.

According to this configuration, the compensation data for distortion compensation processing corresponding to a multimode modulation signal can be acquired efficiently.

The multimode polar modulation transmitter of the invention is, second, the first multimode polar modulation transmitter described above, wherein the first control section further decreases the output level monotonously in a predetermined control width at the calibration operation time.

According to this configuration, the compensation data for distortion compensation processing can be acquired easily in addition to the advantage of the first multimode polar modulation transmitter described above.

The multimode polar modulation transmitter of the invention is, third, the first or second multimode polar modulation transmitter described above, wherein the distortion compensation processing circuit comprises a steady state characteristic compensation circuit for linearizing an output signal in a steady state of the amplification section based on the output signal characteristic relative to the control voltage value in the steady state of the amplification section to which an input high frequency signal of a predetermined amplitude and a control voltage are input.

According to this configuration, the distortion compensation processing circuit can be configured easily in addition to the advantage of the first or second multimode polar modulation transmitter described above.

The multimode polar modulation transmitter of the invention is, fourth, the third multimode polar modulation transmitter described above, wherein the distortion compensation processing circuit further comprises a first amplitude control section for adjusting the amplitude of the amplitude signal after execution of the linearizing processing of the output signal in the steady state in the steady state characteristic compensation circuit.

According to this configuration, the distortion compensation accuracy can be further improved in addition to the advantage of the third multimode polar modulation transmitter described above.

The multimode polar modulation transmitter of the invention is, fifth, the third multimode polar modulation transmitter described above, wherein the distortion compensation processing circuit further comprises a second amplitude control section for adjusting the amplitude of an amplitude signal for address reference when distortion compensation processing of the amplitude signal is performed in the steady state characteristic compensation circuit.

According to this configuration, the distortion compensation accuracy can be further improved in addition to the advantage of the third multimode polar modulation transmitter described above.

The multimode polar modulation transmitter of the invention is, sixth, the third multimode polar modulation transmitter described above, wherein the distortion compensation processing circuit further comprises a first phase compensation section for adjusting the amplitude of an amplitude signal for address reference when distortion compensation processing of the phase signal is performed in the steady state characteristic compensation circuit.

According to this configuration, the distortion compensation accuracy can be further improved in addition to the advantage of the third multimode polar modulation transmitter described above.

The multimode polar modulation transmitter of the invention is, seventh, the third multimode polar modulation transmitter described above, wherein the distortion compensation processing circuit further comprises a second phase compensation section for adjusting the amplitude of the phase signal or the phase modulation signal.

According to this configuration, the distortion compensation accuracy can be further improved in addition to the advantage of the third multimode polar modulation transmitter described above.

The multimode polar modulation transmitter of the invention is, eighth, the third multimode polar modulation transmitter described above, wherein the distortion compensation processing circuit further comprises delay adjustment means for giving a predetermined delay amount to the amplitude signal or the phase signal and ensuring synchronization between the amplitude signal and the phase signal.

According to this configuration, the distortion compensation accuracy can be further improved in addition to the advantage of the third multimode polar modulation transmitter described above.

An integrated circuit of the invention is implemented as any of the first to eighth multimode polar modulation transmitters described above.

According to this configuration, the circuit scale can be decreased in addition to the advantage of any of the first to eighth multimode polar modulation transmitters described above.

A multimode polar modulation transmission method of the invention includes the steps of switching a modulation system of a transmission modulation signal; generating a baseband quadrature signal according to the selected modulation system based on transmission data; generating an amplitude signal from the baseband quadrature signal; generating an amplitude modulation signal based on the amplitude signal; generating a phase modulation signal in a radio frequency band based on a signal containing at least a phase component of the baseband quadrature signal; inputting the phase modulation signal as an input high frequency signal, inputting the amplitude modulation signal as a control signal, and generating transmission data in the radio frequency band; and switching between calibration operation of compensation data used in a distortion compensation processing circuit for performing predetermined distortion compensation processing for at least one of the input signal to the amplitude modulation section and the input signal to the phase modulation section and transmission operation, and at the calibration operation time, a modulation system wherein the amplitude dynamic range of a modulation signal becomes equal to or less than the amplitude dynamic range of a modulation signal in the modulation system used at the transmission operation time is selected.

According to this configuration, the compensation data for distortion compensation processing corresponding to a multimode modulation signal can be acquired efficiently.

A multimode radio communication method of the invention is for conducting radio communications between a base station and a mobile station using the multimode polar modulation transmission method described above.

According to this configuration, the compensation data for distortion compensation processing corresponding to a multimode modulation signal can be acquired efficiently via a radio link.

A radio communication device of the invention includes any of the first to eighth multimode polar modulation transmitters described above or the integrated circuit.

According to this configuration, a radio communication device of the polar modulation system compatible with multimode operation can be realized easily.

A radio communication system of the invention includes any of the first to eighth multimode polar modulation transmitters described above, the integrated circuit, or the radio communication device.

According to this configuration, a radio communication system of the polar modulation system compatible with multimode operation can be realized easily.

The invention provides a distortion compensation processing method in a polar modulation circuit, wherein the deterioration factors from the ideal operation involved in phase modulation and amplitude modulation are separated into the three independent parameters of AM-AM characteristic and AM-PM characteristic dependent on a carrier frequency, coefficient information dependent on the output potential of a power amplifier, and coefficient information dependent on modulation speed for executing compensation.

According to this configuration, the distortion compensation processing data capacity can be decreased while the distortion compensation accuracy is maintained, and the distortion compensation processing data corresponding to a multimode modulation signal adaptively acquired can also be efficiently stored in memory.

The invention provides a multimode radio communication method in a cognitive radio communication device compatible with radio communications systems in a first area and a second area, the multimode radio communication method including the steps of acquiring coefficient information corresponding to the dynamic range of a modulation signal if the first area is left and the second area is entered; acquiring coefficient information corresponding to modulation speed; storing distortion compensation processing data corresponding to the coefficient information in memory; and conducting communications according to a modulation system corresponding to the radio communication system in the second area.

According to this configuration, the art of the invention can be flexibly compatible with the frequency, the modulation system, and the modulation speed varying from one radio communication system to another and if large-capacity memory is not provided for distortion compensation processing data, it can be adaptively compatible with a radio communication system not assumed at the manufacturing time of the radio communication device.

Advantages of the Invention

According to the invention, there can be provided a multimode polar modulation device and a multimode radio communication method for making it possible to decrease the distortion compensation processing data capacity while maintaining the distortion compensation accuracy and also making it possible to efficiently store the distortion compensation processing data corresponding to a multimode modulation signal adaptively acquired in memory.

BRIEF DESCRIPTION OF THE DRAWINGS

FIG. 5 is drawing to show an example of table data stored in a first coefficient selection section 106 in the first embodiment of the invention.

FIG. 6 is a drawing to show the relationship between transmission power regulation and transmission level information.

FIG. 20 is a drawing to show an example of table data stored in a second memory area forming a part of the sixth coefficient selection section 1703 in the first embodiment of the invention.

FIG. 21 is a drawing to show an example of table data stored in the address generation section 1402 in the first embodiment of the invention.

FIG. 26 is a drawing to show an example of table data stored in a seventh coefficient selection section.

FIG. 31 is a drawing to show an example of representative parameter in each radio communication system in the fourth embodiment of the invention.

DESCRIPTION OF REFERENCE NUMERALS AND SIGNS

Figure 1:
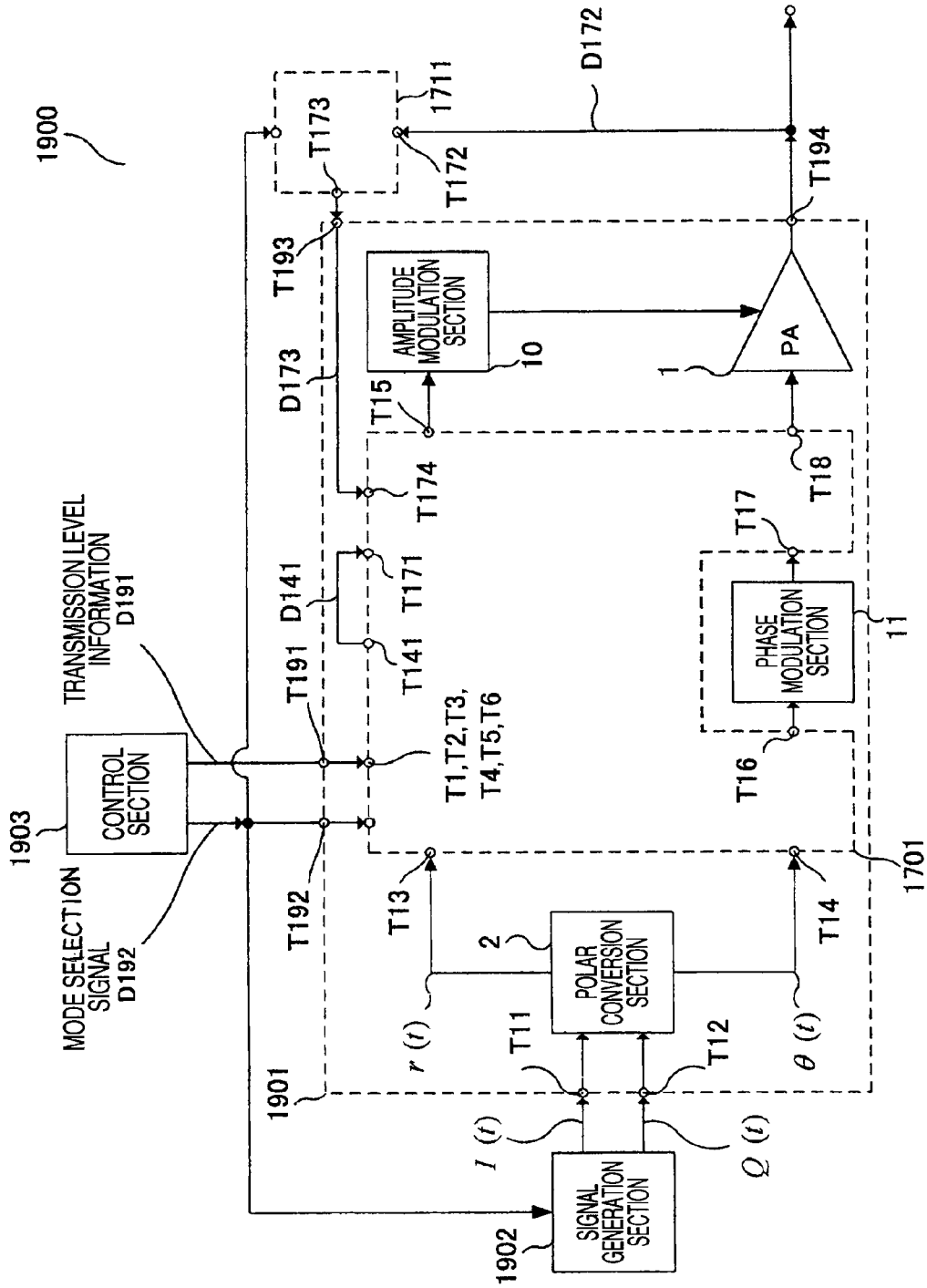
FIG. 1 is a block diagram to show the schematic configuration of a polar modulation transmitter in a first embodiment of the invention.

1 Power amplifier
2 Polar conversion section
3, 1701, 2501 Distortion compensation processing circuit
4, 5 Delay adjustment section
6, 104 Memory
7, 7a, 7b, 1402 Address generation section
8 Amplitude correction section
9 Phase correction section
10 Amplitude modulation section
11 Phase modulation section
12 Amplitude and phase measurement section
20, 1900 Polar modulation transmitter
102, 105a, 107a, 1702, 2503 Multiplication circuit
103 Transmission level control section
105 First amplitude control section
106 First coefficient selection section
107 Second amplitude control section
107b Computation processing circuit
108 Second coefficient selection section
109 Third coefficient selection section
110 Variable attenuation circuit
111 Fourth coefficient selection section
112 Fifth coefficient selection section
113 Amplitude determination section
1301 Addition circuit
1703 Sixth coefficient selection section
1711 Adaptive operation control section
1712, 2303, 2313 Frequency conversion circuit
1713 Detection section
1714 Coefficient control section
1901 Polar modulation circuit
1902 Signal generation section
1903 Control section
2300 Adaptive distortion compensation processing system
2301 Mobile station radio communication device
2302 Mobile station receiver
2304 Demodulation section
2305 System switch section
2311 Base station radio communication device
2312 Base station transceiver
2314 Signal processing section
2315 Conversion section
2502 Seventh coefficient selection section
3001 First area
3002 Second area
3011 First radio communication system
3012 Second radio communication system
3013 Third radio communication system
3014 Fourth radio communication system
3015 Fifth radio communication system
3020 Radio communication device

BEST MODE FOR CARRYING OUT THE INVENTION

Embodiments of the invention will be discussed in detail with reference to the accompanying drawings.

First Embodiment

As a first embodiment of the invention, a multimode polar modulation transmitter capable of decreasing the distortion compensation processing data capacity while maintaining distortion compensation accuracy will be discussed. To being with, an outline of a polar modulation transmitter according to the first embodiment will be discussed.

FIG. 1 is a block diagram to show a schematic configuration of the polar modulation transmitter according to the first embodiment of the invention. As shown in FIG. 1, a polar modulation transmitter 1900 includes a polar modulation circuit 1901, a signal generation section 1902, a control section 1903, and an adaptive operation control section 1711. The polar modulation circuit 1901 includes a power amplifier 1, a polar conversion section 2, a distortion compensation processing circuit 1701, an amplitude modulation section 10, and a phase modulation section 11.

First, control signals concerning the polar modulation transmitter 1900 shown in FIG. 1 will be discussed.

Transmission level information D191 is a control signal for setting the output level from the power amplifier 1.

A mode selection signal D192 is a control signal having a first mode selection signal for executing operation switching between an optimization mode (calibration mode) of distortion compensation coefficient information in the distortion compensation processing circuit 1701 and a transmission operation mode as the operation mode of the polar modulation transmitter 1900 and a second mode selection signal to set a modulation mode of a signal output from the signal generation section 1902.

(1) Basic Configuration of Polar Modulation Transmitter

Next, the configuration of the polar modulation transmitter 1900 shown in FIG. 1 will be discussed.

The signal generation section 1902 generates a baseband quadrature coordinate signal (IQ signal) from transmission data based on user operation of a radio communication device implemented as the polar modulation transmitter 1900 in the modulation mode set by the second mode selection signal output from the control section 1903, and outputs the IQ signal to the polar conversion section 2 through a signal input terminal T11 and a signal input terminal T12.

The control section 1903 outputs the transmission level information D191 to the distortion compensation processing circuit 1701. Specifically, the control section 1903 outputs the transmission level information D191 to the polar modulation circuit 1901 through a signal input terminal T191. Upon reception of the transmission level information D191, the polar modulation circuit 1901 outputs the transmission level information D191 to the distortion compensation processing circuit 1701 through signal input terminals T1, T2, T3, T4, T5, and T6. The control section 1903 outputs the second mode selection signal to the signal generation section 1902, outputs the first mode selection signal and the second mode selection signal to the polar modulation circuit 1901 through a signal input terminal T192, and further outputs the first mode selection signal to the adaptive operation control section 1711.

In the calibration mode, the control section 1903 outputs the second mode selection signal for selecting a modulation system becoming equal to or less than the amplitude D-range of a modulation signal in the modulation system used in a transmission operation mode. The distortion compensation processing circuit 1701 optimizes distortion compensation coefficient information as an example of compensation data in the distortion compensation processing circuit 1701 while referencing a control signal D173 from the adaptive operation control section 1711 in a modulation system in which the amplitude D-range of a modulation signal is narrow.

Thus, the distortion compensation coefficient information is previously found using a signal with a narrow amplitude D-range and is referenced as compensation data at the transmission time of a modulation signal having a wider amplitude D-range, whereby it is made possible to solve contrary problems of suppressing an increase in the distortion compensation processing data capacity and ensuring the compensation accuracy at the same time to make it possible for the polar modulation transmitter to be compatible with the multimode operation.

(2) Basic Configuration of Polar Modulation Circuit

According to the examination made so far by the present inventors, it is revealed that although it is not easy to previously acquire the dynamic characteristics (AM-AM dynamic characteristic and AM-PM dynamic characteristic) of a power amplifier, when the distortion compensation processing circuit 1701 performs predetermined computation processing based on the AM-AM forward characteristic and the AM-PM forward characteristic of a power amplifier acquired as a control voltage in a steady state is supplied, the dynamic characteristics of the power amplifier can be compensated for with high accuracy although the configuration is simple.

Then, first the AM-AM dynamic characteristic compensation art and the AM-PM dynamic characteristic compensation art of a power amplifier will be discussed.

Figure 2:
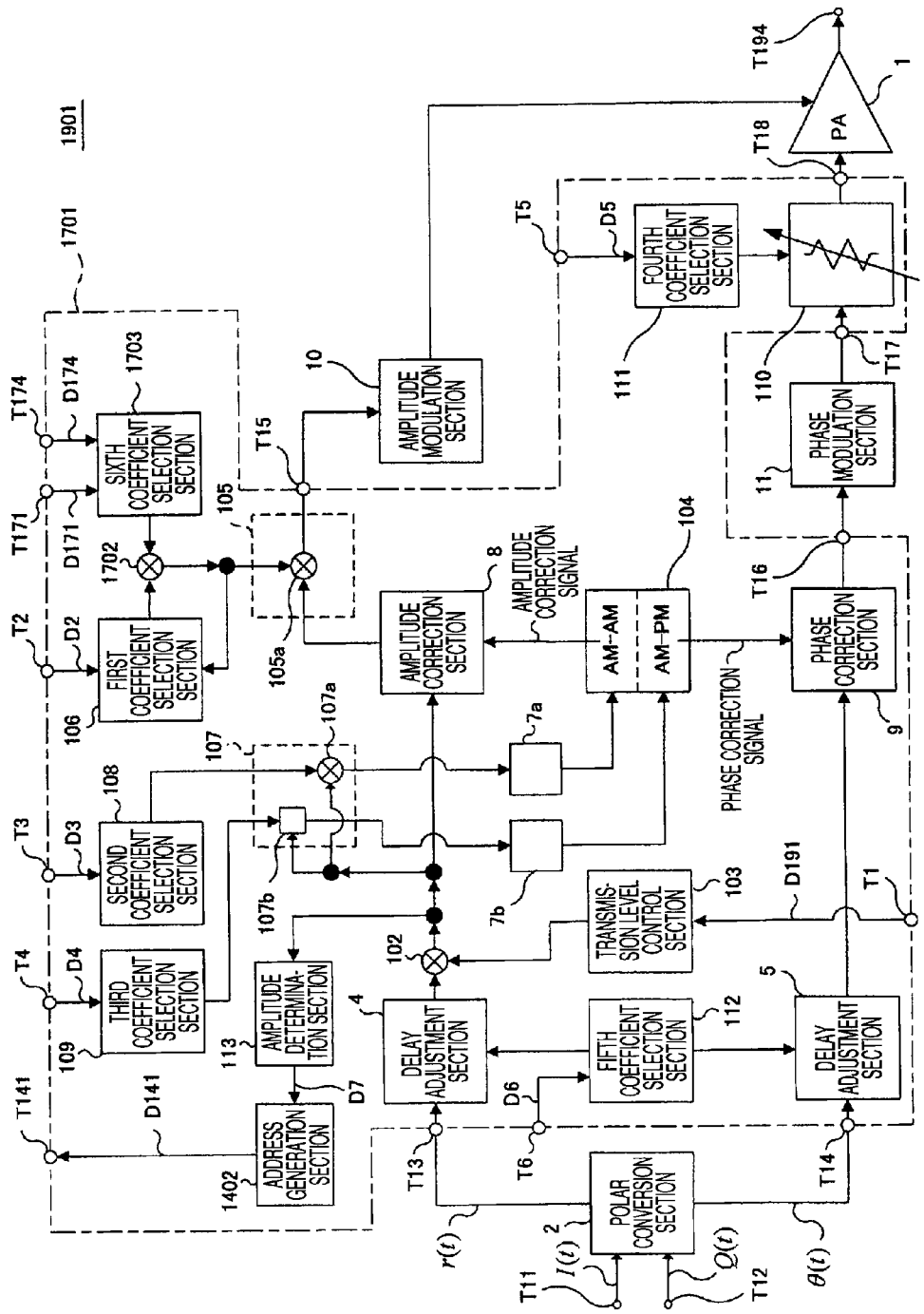
FIG. 2 is a block diagram to show the schematic configuration of a polar modulation circuit in the first embodiment of the invention.

FIG. 2 is a block diagram to show a schematic configuration of a polar modulation circuit in the first embodiment of the invention.

As shown in FIG. 2, the polar modulation circuit 1901 includes the power amplifier 1, the polar conversion section 2, the distortion compensation processing circuit 1701, the amplitude modulation section 10, and the phase modulation section 11. The distortion compensation processing circuit 1701 includes delay adjustment sections 4 and 5, address generation sections 7a and 7b, an amplitude correction section 8, a phase correction section 9, a multiplication circuit 102, a transmission level control section 103 having the signal input terminal T1, memory 104, a first amplitude control section 105 implemented as a multiplication circuit 105a, a first coefficient selection section 106 having the signal input terminal T2, a second amplitude control section 107 made up of a multiplication circuit 107a and a computation processing circuit 107b, a second coefficient selection section 108 having the signal input terminal T3, a third coefficient selection section 109 having the signal input terminal T4, a variable attenuation circuit 110, a fourth coefficient selection section 111 having the signal input terminal T5, a fifth coefficient selection section 112 having the signal input terminal T6, an amplitude determination section 113 having a signal output terminal T7, an address generation section 1402, a multiplication circuit 1702, and a sixth coefficient selection section 1703 having signal input terminals T171 and T174.

Figure 29:
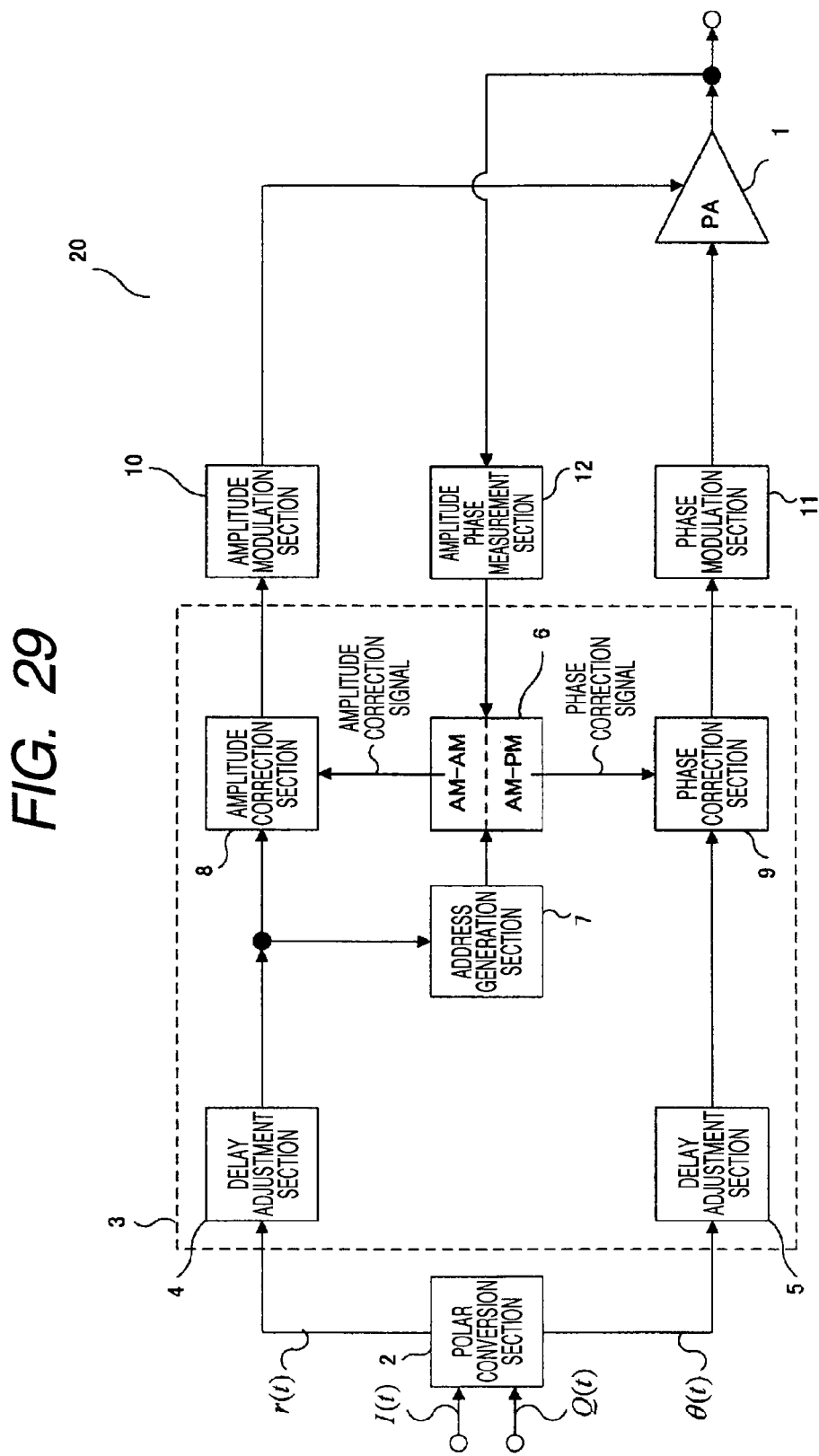
FIG. 29 is a diagram to show a polar modulation transmitter in a related art.

That is, in the polar modulation circuit 1901 in the first embodiment of the invention, the amplitude and phase measurement section 12 is eliminated from the polar modulation transmitter 20 in the related art shown in FIG. 29 and the memory 104 and the address generation sections 7a and 7b are included in place of the memory 6 and the address generation section 7. It newly includes the multiplication circuit 102, the transmission level control section 103, the first amplitude control section 105, the first coefficient selection section 106, the second amplitude control section 107, the second coefficient selection section 108, the third coefficient selection section 109, the variable attenuation circuit 110, the fourth coefficient selection section 111, the fifth coefficient selection section 112, the amplitude determination section 113, the address generation section 1402, the multiplication circuit 1702, and the sixth coefficient selection section 1703.

The polar conversion section 2 separates a baseband quadrature coordinate signal (IQ signal) input from the signal generation section 1902 into an amplitude signal r(t) and a constant-amplitude phase signal θ(t) through the signal input terminal T11 and the signal input terminal T12. Here, r(t) is normalized with a predetermined value, for example, 1.

The distortion compensation processing circuit 1701 performs predetermined distortion compensation processing for the amplitude signal r(t) and the phase signal θ(t) generated by the polar conversion section 2, the signals input through a signal input terminal T13 and a signal input terminal T14. The distortion compensation processing circuit 1701 outputs the amplitude signal after subjected to amplitude correction to the amplitude modulation section 10 through a signal output terminal T15 and also outputs the phase signal after subjected to phase correction to the phase modulation section 11 through a signal output terminal T16. The configuration and the operation of the distortion compensation processing circuit 1701 are described later.

The amplitude modulation section 10 drives the control voltage of the power amplifier 1 based on the amplitude signal output from the distortion compensation processing circuit 1701 through the signal output terminal T15.

The phase modulation section 11 executes phase modulation based on the phase signal output from the distortion compensation processing circuit 1701 through the signal output terminal T16 and also outputs a phase modulation signal to the distortion compensation processing circuit 1701 through a signal input terminal T17.

The power amplifier 1 combines amplitude modulation with the phase modulation signal output from the distortion compensation processing circuit 1701 through a signal output terminal T18 based on the output signal from the amplitude modulation section 10 as a control signal.

Next, the configuration and the operation of the distortion compensation processing circuit 1701 will be discussed in detail. The operation of the amplitude modulation section 10 and the phase modulation section 11 will be again discussed in detail to clarify the input/output relationship of signals to/from the distortion compensation processing circuit 1701.

First, the configuration concerning the signal path of an amplitude signal will be discussed.

The delay adjustment section 4 gives a predetermined delay to the amplitude signal input from the polar conversion section 2 through the signal input terminal T13 based on fifth coefficient information (coeff5) output from the fifth coefficient selection section 112, and outputs the amplitude signal after subjected to the delay adjustment to the multiplication circuit 102. The delay adjustment method is described later.

The multiplication circuit 102 multiplies the amplitude signal output from the delay adjustment section 4 by a power control coefficient (PCL) output from the transmission level control section 103, and outputs the amplitude signal after multiplied by the power control coefficient to the amplitude correction section 8, the second amplitude control section 107, and the amplitude determination section 113.

The transmission level control section 103 stores the power control coefficient corresponding to the transmission level information D191 of the power amplifier 1 input from the control section 1903 in memory, and outputs the power control coefficient to the multiplication circuit 102 with the transmission level information D191 input through the signal input terminal T1 as an address signal.

Figure 3:
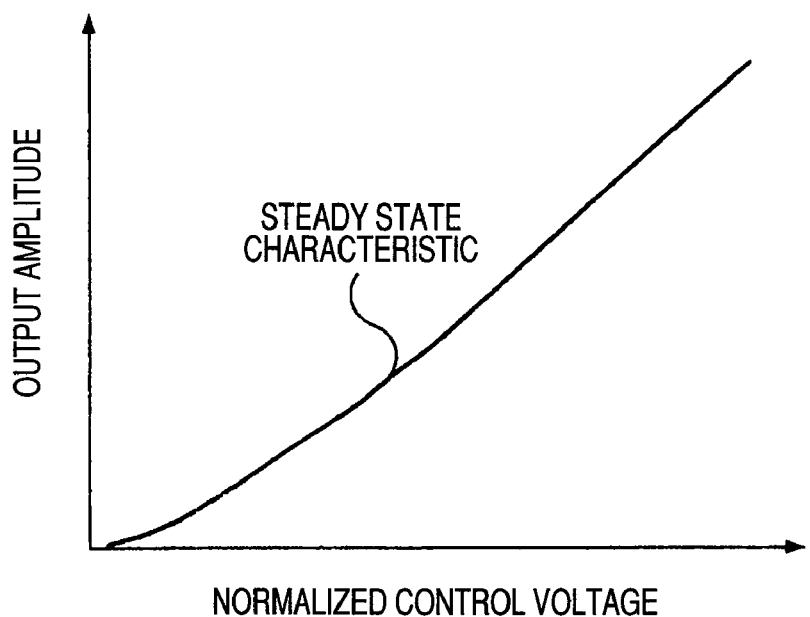
FIG. 3 shows the AM-AM characteristic of a power amplifier.
Figure 4:
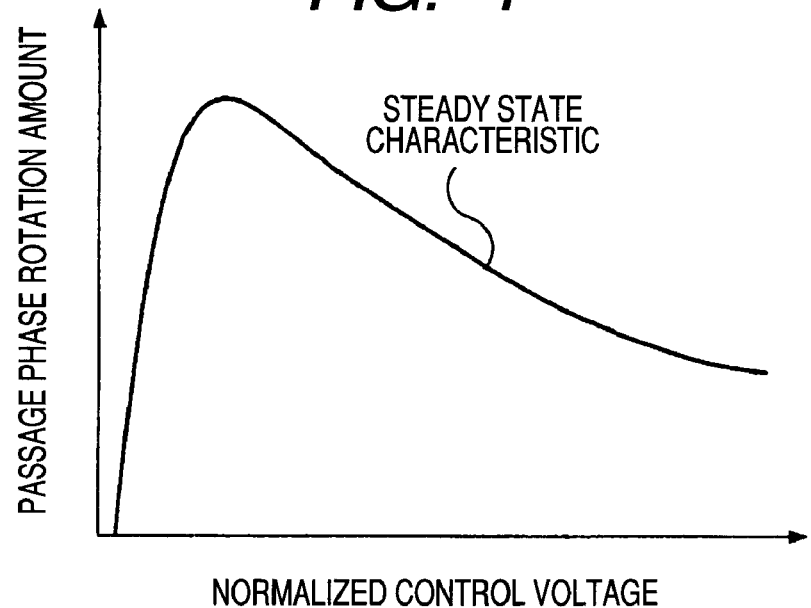
FIG. 4 shows the AM-PM characteristic of the power amplifier.

The memory 104 stores the inverse characteristics of the AM-AM forward characteristic and the AM-PM forward characteristic of the power amplifier 1 previously acquired using a network analyzer, etc. The AM-AM forward characteristic and the AM-PM forward characteristic of the power amplifier 1 are as shown in FIGS. 3 and 4, for example. In FIG. 3, the horizontal axis indicates the normalized control voltage normalized with the maximum value of the control voltage supplied to the power amplifier 1, the vertical axis indicates the output amplitude from the power amplifier 1, and the solid line in the figure indicates the steady state characteristic of the output amplitude relative to the normalized control voltage.

Next, in FIG. 4, the horizontal axis indicates the normalized control voltage, the vertical axis indicates the phase difference between an input high frequency signal to the power amplifier 1 and an output high frequency signal, namely, the passage phase rotation amount of the power amplifier 1, and the solid line in the figure indicates the steady state characteristic of the passage phase rotation amount relative to the normalized control voltage. The memory 104 outputs an amplitude correction signal of the inverse characteristic of the power amplifier 1 to the amplitude correction section 8 in response to a first address signal output from the address generation section 7*a* and also outputs a phase correction signal of the inverse characteristic of the power amplifier 1 to the phase correction section 9 in response to a second address signal output from the address generation section 7*b*. The characteristics in FIGS. 3 and 4 show the steady state characteristics when output of the power amplifier is stabilized after the control voltage is supplied.

The address generation section 7*a* converts the amplitude signal output from the multiplication circuit 107*a* forming a part of the second amplitude control section 107 into a discrete value having a predetermined range and a predetermined step width, found from the AM-AM inverse characteristic data stored in the memory 104 and compensation accuracy, and then generates a first address signal to refer to the AM-AM inverse characteristic data stored in the memory 104.

The address generation section 7*b* converts the amplitude signal output from the computation processing circuit 107*b* forming a part of the second amplitude control section 107 into a discrete value having a predetermined range and a predetermined step width, found from the AM-PM inverse characteristic data stored in the memory 104 and compensation accuracy, and then generates a second address signal to refer to the AM-PM inverse characteristic data stored in the memory 104.

The amplitude correction section 8 makes a correction to the amplitude signal output from the multiplication circuit 102 based on the amplitude correction signal output from the memory 104 and outputs the amplitude signal after subjected to the amplitude correction to the first amplitude control section 105.

The amplitude determination section 113 samples the amplitude signal output from the multiplication circuit 102 at regular intervals, finds an instantaneous amplitude value, and outputs this instantaneous amplitude value to the address generation section 1402 as amplitude data D7.

The address generation section 1402 generates a third address signal D141 to refer to compensation data in the sixth coefficient selection section 1703 according to a method described later based on the amplitude data D7 output from the amplitude determination section 113, and outputs the third address signal D141 to the sixth coefficient selection section 1703 through a signal output terminal T141 and the signal input terminal T171.

The first coefficient selection section 106 stores coefficient information corresponding to predetermined data D2 input from the signal input terminal T2 as table data shown in FIG. 5. The first column of the table data shown in FIG. 5 indicates the address number of the table data and the second column indicates coefficient information (coeff1) set by a method described later. The data D2 is the transmission level information D191. The first coefficient selection section 106 adopts a configuration for updating the table data according to coefficient information output from the multiplication circuit 1702 in the coefficient information calibration mode.

The sixth coefficient selection section 1703 has two memory areas. The first memory area is used in the coefficient information calibration mode and stores sixth coefficient information (coeff6) in a format corresponding to data D174 input from the signal input terminal T174. The second memory area forming a part of the sixth coefficient selection section 1703 is used in the transmission operation mode and stores sixth coefficient information in a format corresponding to data D171 input from the signal input terminal T171. Therefore, the first and second memory areas differ in the storage format of the sixth coefficient information.

Figures 17, 18:
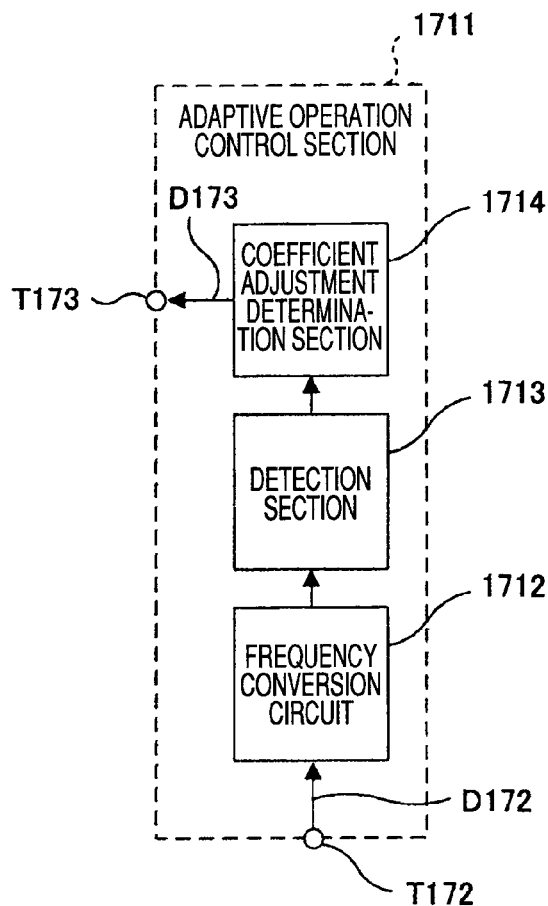
FIG. 17 is a diagram to show an adaptive operation control section in the first embodiment of the invention.
FIG. 18 is a drawing to show an example of table data stored in a first memory area forming a part of a sixth coefficient selection section 1703 in the first embodiment of the invention.

The first memory area is in a format shown in FIG. 18; the first column of the table data indicates the address number of the table data and the second column indicates the sixth coefficient information in a predetermined range containing 1. In this example, coefficient information "1" is stored in address number Q and each coefficient information is set so that it is monotonously decreased with an increase in the address number in such a manner that the coefficient information corresponding to the address number smaller than Q is set larger than "1" and the coefficient information corresponding to the address number larger than Q is set smaller than "1," for example. The data D174 is the control signal D173 output from the adaptive operation control section 1711.

The second memory area is an area in which the data under the second column of the table data shown in FIG. 5 is replaced with the sixth coefficient information (coeff6) set by a method described later. The data D171 is the data D141 output from the address generation section 1402. Unless otherwise described, the sixth coefficient selection section 1703 outputs "1" as the sixth coefficient information in the transmission operation mode.

The multiplication circuit 1702 multiplies first coefficient information output from the first coefficient selection section 106 by the sixth coefficient information output from the sixth coefficient selection section 1703 and outputs the product of the coefficient information to the first amplitude control section 105 in the transmission operation mode and outputs the product of the coefficient information to the first coefficient selection section 106 in the coefficient information calibration mode.

The first amplitude control section 105 is implemented as the multiplication circuit 105a. The multiplication circuit 105a multiplies the amplitude signal output from the amplitude correction section 8 by the product of the coefficient information output from the multiplication circuit 1702 and outputs the amplitude signal after multiplied by the product to the amplitude modulation section 10 through the signal output terminal T15.

The second amplitude control section 107 is made up of the multiplication circuit 107a and the computation processing circuit 107b. The multiplication circuit 107a multiplies the amplitude signal output from the multiplication circuit 102 by second coefficient information (coeff2) output from the second coefficient selection section 108 and outputs the amplitude signal after multiplied by the second coefficient information to the address generation section 7a. The computation processing circuit 107b performs predetermined computation processing for the amplitude signal output from the multiplication circuit 102 based on third coefficient information (coeff3) output from the third coefficient selection section 109 and outputs the amplitude signal after subjected to the computation processing to the address generation section 7b. The second amplitude control section 107 is characterized in that it can multiply the amplitude signals used when the address generation sections 7a and 7b generate the first address signal and the second address signal by different coefficient information. The predetermined computation processing performed by the computation processing circuit 107b refers to computation processing of multiplying the amplitude signal output from the multiplication circuit 102 by the third coefficient information (coeff3) output from the third coefficient selection section 109 or adding the third coefficient information (coeff3) to the amplitude signal, for example.

The second coefficient selection section 108 previously stores coefficient information corresponding to predetermined data D3 input from the signal input terminal T3 as table data so as to set the second coefficient information multiplied in the multiplication circuit 107a. This table data is provided by replacing the data under the second column of the table data shown in FIG. 5 with the second coefficient information set by a method described later. The data D3 is the transmission level information D191.

The third coefficient selection section 109 previously stores coefficient information corresponding to predetermined data D4 input from the signal input terminal T4 as table data so as to set the third coefficient information multiplied in the computation processing circuit 107b. This table data is provided by replacing the data under the second column of the table data shown in FIG. 5 with the third coefficient information set by a method described later. The data D4 is the transmission level information D191.

The amplitude modulation section 10 drives the control voltage of the power amplifier 1 based on the amplitude signal output from the multiplication circuit 105a through the signal output terminal T15.

Next, the configuration concerning the signal path of a phase signal will be discussed.

The delay adjustment section 5 gives a predetermined delay to the phase signal input from the polar conversion section 2 through the signal input terminal T14 based on the fifth coefficient information (coeff5) output from the fifth coefficient selection section 112, and outputs the phase signal after subjected to the delay adjustment to the phase correction section 9. The delay adjustment method is described later together with the delay adjustment in the delay adjustment section 4.

The phase correction section 9 makes a correction to the phase signal output from the delay adjustment section 5 based on the phase correction signal output from the memory 104, and outputs the phase signal after subjected to the phase correction to the phase modulation section 11 through the signal output terminal T16.

The phase modulation section 11 executes phase modulation based on the phase signal after subjected to the phase correction output from the phase correction section 9 through the signal output terminal T16, and outputs a phase modulation signal to the variable attenuation circuit 110 through the signal input terminal T17.

The variable attenuation circuit 110 adjusts the amplitude value (attenuation amount) of the phase modulation signal input from the phase modulation section 11 through the signal input terminal T17 in response to fourth coefficient information (coeff4) output from the fourth coefficient selection section 111, and outputs the phase modulation signal after subjected to the amplitude adjustment to the power amplifier 1 through the signal output terminal T18. A variable gain amplifier may be used in place of the variable attenuation circuit.

The fourth coefficient selection section 111 previously stores coefficient information corresponding to predetermined data D5 input from the signal input terminal T5 as table data so as to set the fourth coefficient information to determine the attenuation amount in the variable attenuation circuit 110. This table data is provided by replacing the data under the second column of the table data shown in FIG. 5 with the fourth coefficient information set by a method described later. The data D5 is the transmission level information D191.

Subsequently, the configuration concerning the delay adjustment between the signal paths of the amplitude signal and the phase signal will be discussed.

The fifth coefficient selection section 112 previously stores coefficient information corresponding to predetermined data D6 input from the signal input terminal T6 as table data so as to set the synchronous adjustment amount of synchronously adjusting between the amplitude signal and the phase signal output from the polar conversion section 2 performed by the delay adjustment section 4 and the delay adjustment section 5. This table data is provided by replacing the data under the second column of the table data shown in FIG. 5 with the fifth coefficient information (coeff5) set by a method described later. The data D6 is the transmission level information D191.

(3) Operation of Distortion Compensation Processing Circuit (in Transmission Operation Mode)

Next, the operation of the distortion compensation processing circuit 1701 in the transmission operation mode will be discussed separately in four topics of a power control method of the power amplifier 1, an AM-AM dynamic characteristic compensation method of the power amplifier 1, an AM-PM dynamic characteristic compensation method of the power amplifier 1, and a compensation method for the delay between the paths of the amplitude signal and the phase signal.

The power control method of the power amplifier 1 will be discussed concerning use of the multiplication circuit 102 and the transmission level control section 103.

Next, the AM-AM dynamic characteristic compensation method of the power amplifier 1 will be discussed concerning two points of use of the multiplication circuit 105a and the first coefficient selection section 106 and use of the multiplication circuit 107a and the second coefficient selection section 108.

The AM-PM dynamic characteristic compensation method of the power amplifier 1 will be discussed concerning two points of use of the computation processing circuit 107b and the third coefficient selection section 109 and use of the variable attenuation circuit 110.

Further, the compensation method for the delay between the paths of the amplitude signal and the phase signal will be the discussed concerning use of the fifth coefficient selection section 112, the delay adjustment section 4, and the delay adjustment section 5.

(3-1) Power Control Method

First, the power control method using the multiplication circuit 102 and the transmission level control section 103 will be discussed with FIGS. 2, 6, 7, and 8.

FIG. 6 is a drawing to a specific example of the transmission level information D191 of the power amplifier 1 output from the control section 1903 of the polar modulation transmitter 1900.

The first column of the table data shown in FIG. 6 indicates the power value [dBm] of transmission power regulation of an uplink for a radio communication device transmission section for transmitting in 8-PSK modulation in a 900-MHz GMS band, described in GSM specifications, and the second column indicates the transmission level information D191.

Figures 7, 8:
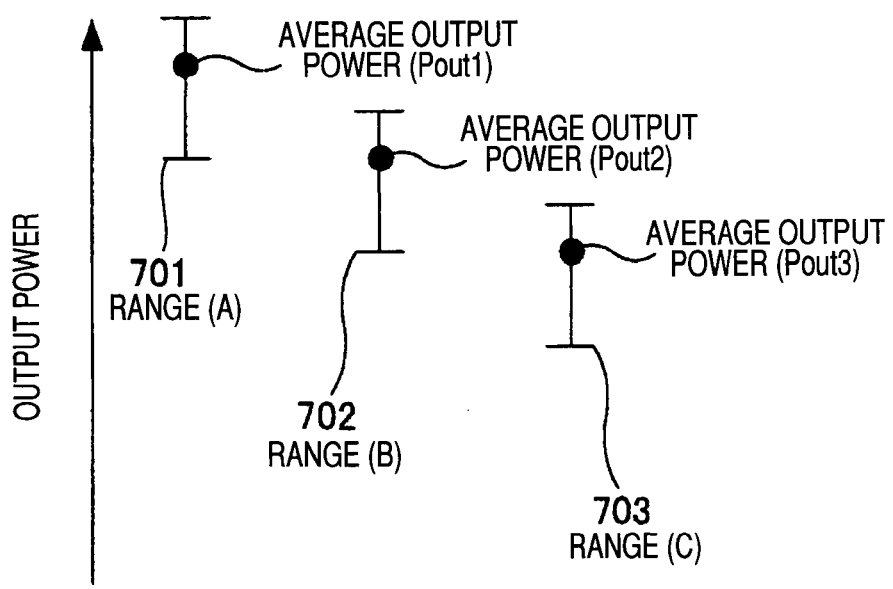
FIG. 7 is a drawing to show an example of a power control coefficient (PCL) stored in a transmission level control section 103.
FIG. 8 is a drawing to show D-ranges of instantaneous output power for an 8-PSK modulation signal in an output section of the power amplifier 1.

FIG. 7 shows a power control coefficient (PCL) stored in the transmission level control section 103 if the control step width of transmission power is 2 dB as shown in FIG. 6. The first column of the table data shown in FIG. 7 indicates the address number of the table data and the second column indicates the power control coefficients.

The relationship between the power control coefficients corresponding to address number M and address number (M+1) with the power control coefficient corresponding to the address number 1 set to 1 is represented by the following expression (1):

$$PCL_{M+1} = PCL_M \times 10^{-\frac{2}{20}} \tag{1}$$

The transmission level control section 103 outputs the power control coefficient thus set in response to the transmission level information 191 input through the signal input terminal T1 and multiplies the amplitude signal by the power control coefficient, thereby overlaying power control information on the amplitude signal.

FIG. 8 is a drawing to show the D-range of instantaneous output power for an 8-PSK modulation signal in the output section of the power amplifier 1; the vertical axis indicates output power displayed in dB units.

Range (A) 701 is the D-range of instantaneous output power for the 8-PSK modulation signal when average output power is Pout1.

Range (B) 702 is the D-range of instantaneous output power for the 8-PSK modulation signal when average output power is Pout2.

Range (C) 703 is the D-range of instantaneous output power for the 8-PSK modulation signal when average output power is Pout3.

The relationship among Pout1, Pout2, and Pout3 is represented by the following expression (2). Letting PCLs corresponding to Pout1, Pout2, and Pout3 be PCL (1), PCL (2), and PCL (3), they become correlation shown in the following expression (3).

$$Pout1 > Pout2 > Pout3 \tag{2}$$

$$PCL\ (1) > PCL\ (2) > PCL\ (3) \tag{3}$$

That is, if the power control information is superposed on the amplitude signal, the time waveform shifted in parallel relative to the output power axis although the D-ranges of the amplitude signal are the same relative to the output power axis displayed in dB units is obtained as an output signal from the power amplifier 1.

As described so far, in the polar modulation transmitter 1900, the amplitude component of a modulation signal and the power control information are represented using the amplitude signal; the control step of the amplitude signal according to the power control information is by far coarse as compared with the resolution of the amplitude value required for the amplitude component.

(3-2) AM-AM Dynamic Characteristic Compensation Method

Next, the AM-AM dynamic characteristic compensation method using the multiplication circuit 105a and the first coefficient selection section 106 will be discussed with FIGS. 2 and 9. Here, the second coefficient information is set to "1."

Figure 9:
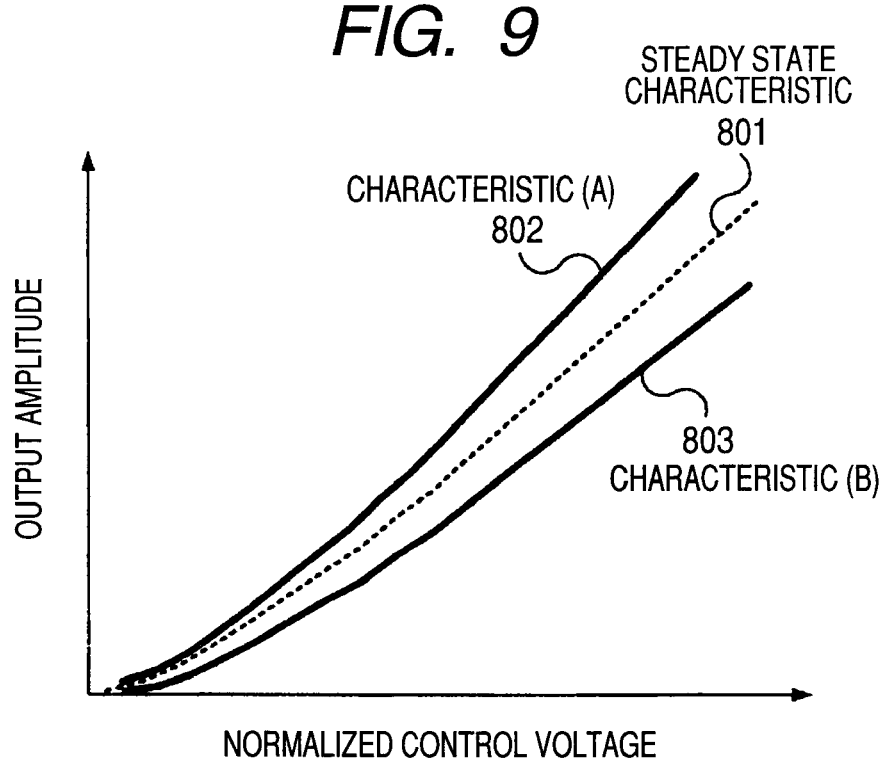
FIG. 9 shows the AM-AM characteristic of the power amplifier.

In FIG. 9, the horizontal axis indicates the normalized control voltage normalized with a predetermined value of the control voltage supplied to the power amplifier 1, and the vertical axis indicates the output amplitude from the power amplifier 1.

Steady state characteristic 801 indicated by the dotted line indicates the steady state characteristic (AM-AM forward characteristic) of the output amplitude relative to the normalized control voltage and is the same as the steady state characteristic shown in FIG. 3.

Characteristic (A) 802 indicated by the solid line indicates the forward characteristic of the AM-AM characteristic stored in the memory 104 to obtain an amplitude signal equivalent to the amplitude signal after subjected to AM-AM characteristic compensation using the steady state characteristic 801 as an input signal to the amplitude modulation section 10 if the first coefficient information meets the following expression (4).

Characteristic (B) 803 indicated by the solid line indicates the forward characteristic of the AM-AM characteristic stored in the memory 104 to obtain an amplitude signal equivalent to the amplitude signal after subjected to AM-AM characteristic compensation using the steady state characteristic 801 as an input signal to the amplitude modulation section 10 if the first coefficient information meets the following expression (5).

$$\text{coeff } 1 > 1 \tag{4}$$

$$\text{coeff } 1 < 1 \tag{5}$$

The above-mentioned relationship indicates that, for example, it is possible to apply to the compensation if an error occurs between the AM-AM dynamic characteristic of the power amplifier 1 in an amplitude modulation operation state and AM-AM forward characteristic data at the characteristic acquiring time of the power amplifier 1.

Therefore, if the inverse characteristic stored in the memory 104 is not changed, a similar effect to adjusting of the inverse characteristic stored in the memory 104 can be provided by adjusting the first coefficient information.

The AM-AM dynamic characteristic compensation method using the multiplication circuit 107a and the second coefficient selection section 107 also involves similar relationship and will be discussed with FIGS. 2 and 9 as with the description given above. Here, the first coefficient information is set to "1."

The characteristic (A) 802 is the forward characteristic of the AM-AM characteristic stored in the memory 104 to obtain an amplitude signal equivalent to the amplitude signal after subjected to AM-AM characteristic compensation using the steady state characteristic 801 as an input signal to the amplitude modulation section 10 if the second coefficient information meets the following expression (6) in multiplication processing of the second coefficient information in the multiplication circuit 107a.

The characteristic (B) 803 is the forward characteristic of the AM-AM characteristic stored in the memory 104 to obtain an amplitude signal equivalent to the amplitude signal after subjected to AM-AM characteristic compensation using the steady state characteristic 801 as an input signal to the amplitude modulation section 10 if the second coefficient information meets the following expression (7) in multiplication processing of the second coefficient information in the multiplication circuit 107a is the characteristic (B) 803.

Therefore, if the inverse characteristic stored in the memory 104 is not changed, a similar effect to adjusting of the inverse characteristic stored in the memory 104 can be provided by adjusting the second coefficient information as in the description of the AM-AM dynamic characteristic compensation method using the multiplication circuit 105a and the first coefficient selection section 106.

$$\text{coeff } 2 > 1 \tag{6}$$

$$\text{coeff } 2 < 1 \tag{7}$$

The transmission level information D191 described with FIG. 6 is given as the data D2 input to the first coefficient selection section 106. The meaning of selecting the first coefficient information based on the transmission level information D191 will be discussed with FIG. 10.

Figure 10:
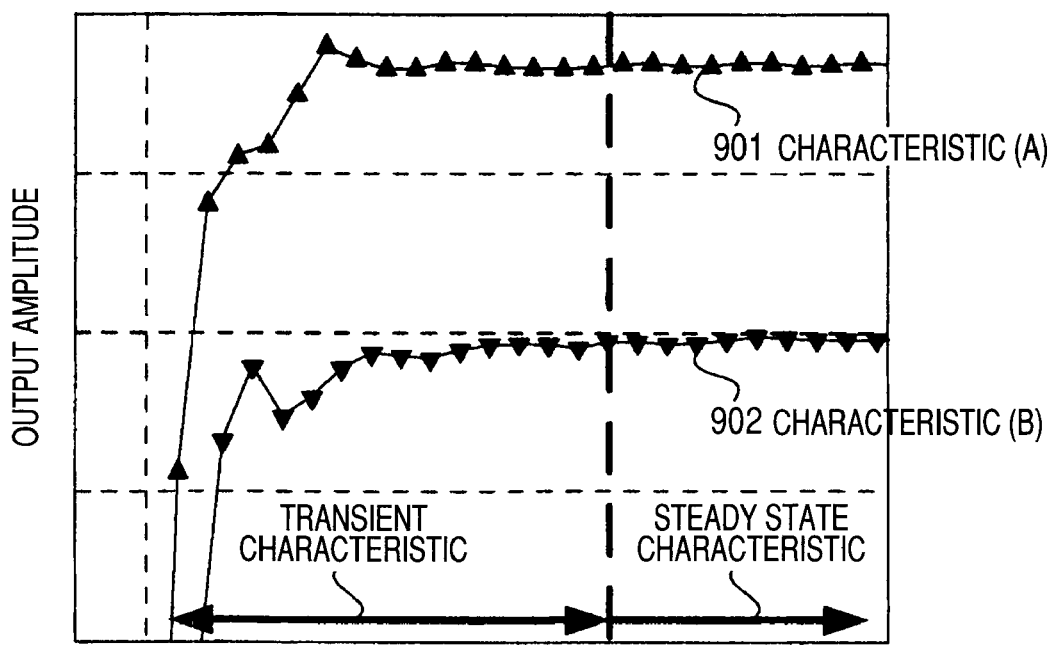
FIG. 10 is a drawing to show step response characteristic of output amplitude relative to a control voltage in a state in which an input high frequency signal at a level of saturation operation of the power amplifier is given.

FIG. 10 is a drawing to show the step response characteristic of the output signal amplitude relative to the control voltage in a state in which input high frequency signal amplitude at a predetermined level is given to the power amplifier 1. In FIG. 10, the horizontal axis indicates the elapsed time since the input time of a control signal to the power amplifier 1, and the vertical axis indicates the output signal amplitude from the power amplifier 1. In the example in FIG. 10, characteristic (A) 901 and characteristic (B) 902 are shown as the step response characteristics to two different control voltage values (steady state control voltage values) and differ in the output amplitude from the power amplifier in the steady state characteristic. In the two step response characteristics shown in FIG. 10, a supplied control voltage value when the characteristic (A) 901 is measured, is higher than that when the characteristic (B) 902 is measured.

If distortion compensation is executed by referencing the AM-AM inverse characteristic data stored in the memory 104, a desired compensation effect cannot be obtained for the amplitude modulation signal changing at high speed because of the output response of the amplitude modulation section 10 or the power amplifier 1. However, as a result of examination of the present inventors, it was found that compensation accuracy can be improved by previously measuring the step response characteristic of the power amplifier 1 when the control voltage of a given value to obtain average output power of modulation signal for each transmission output power defined in the specification of a radio system (for example, GSM specification, etc., is supplied and multiplying the amplitude signal by a predetermined value in response to the step response characteristic.

For example, if the transient response characteristic is in an overshoot state as in the characteristic (A) 901 in FIG. 10, the first coefficient selection section 106 outputs first coefficient information less than "1" to the first amplitude control section 105 so that the output signal from the multiplication circuit 105a to the amplitude modulation section 10 is attenuated for the input signal from the amplitude correction section 8 to the multiplication circuit 105a. Conversely, if convergence occurs not exceeding a predetermined value during the transient response period as in the characteristic (B) 902 in FIG. 10, the first coefficient selection section 106 outputs first coefficient information equal to or more than "1" to the multiplication circuit 105a so as to amplify the output signal for the input signal to the multiplication circuit 105a.

That is, when the control voltage of a given value to obtain average output power of transmission modulation signal is supplied, if the starting characteristic of the power amplifier 1 is overshot, the amplitude signal corrected in the steady state characteristic is compressed, and if not the amplitude signal is decompressed, so that any desired output amplitude can be obtained considering the effect of the transient response. The processing is equivalent to performing processing of finding the characteristic (A) 802 or the characteristic (B) 803 from the steady state characteristic 801 using the first coefficient information as described with FIG. 9 in response to the transmission power level. Similar comments also apply to the second coefficient information.

As described above, the first coefficient information found for each transmission level is stored in the first coefficient selection section 106 in the format shown in FIG. 5. Although the first coefficient information is described taking a different value for each transmission level, if the same value is taken for the close power value from the characteristic of the power amplifier 1, thinned data may be stored so as to reduce the table data. The description on the settings of the first coefficient information and the second coefficient information is now complete.

According to the examination in the process to the invention, it was found that the compensation accuracy can be further improved by sweeping the control voltage of the power amplifier 1 in the step width narrower than the transmission level regulation, previously acquiring the first coefficient information or the second coefficient information, and selecting the first coefficient information or the second coefficient information in response to the third address signal D141 based on the amplitude value of the amplitude signal output from the address generation section 1402 and that the effect becomes larger if a signal at high demodulation speed is transmitted. Therefore, in the Description, the first coefficient information output from the first coefficient selection section 106 based on the transmission level information D191 is multiplied by the sixth coefficient information output from the sixth coefficient selection section 1703 based on the third address signal D141.

Although not described in FIG. 2, the second coefficient information output from the second coefficient selection section 108 based on the transmission level information D191 may be multiplied by the coefficient information output based on the third address signal D141, or the first coefficient selection section 106 or the second coefficient selection section 108 may be placed in a format for storing coefficient information corresponding to the third address signal D141 and may output the first coefficient information or the second coefficient information based on the third address signal D141.

(3-3) AM-PM Dynamic Characteristic Compensation Method

Next, the AM-PM dynamic characteristic compensation method using the computation processing circuit 107*b* and the third coefficient selection section 109 will be discussed with FIGS. 2, 11, 12 and 13.

Figure 11:
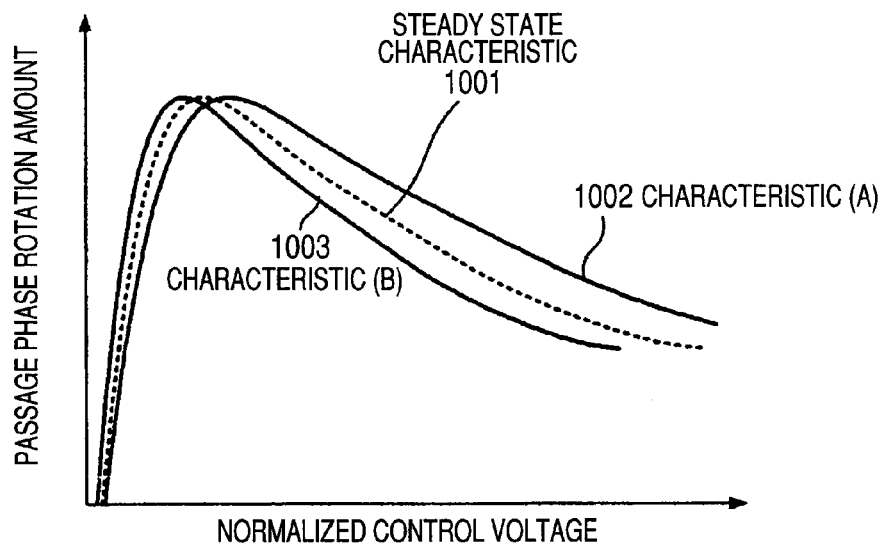
FIG. 11 shows the AM-PM characteristic of the power amplifier.

In FIG. 11, the horizontal axis indicates the normalized control voltage and the vertical axis indicates the passage phase rotation amount of the power amplifier 1.

Steady state characteristic 1001 indicated by the dotted line indicates the steady state characteristic (AM-PM forward characteristic) of the passage phase rotation amount relative to the normalized control voltage and is the same as the steady state characteristic shown in FIG. 4.

Characteristic (A) 1002 indicated by the solid line indicates the forward characteristic of the AM-PM characteristic stored in the memory 104 to obtain a phase signal equivalent to the phase signal after subjected to AM-PM characteristic compensation using the steady state characteristic 1001 as an input signal to the phase modulation section 11 if the computation processing circuit 107*b* is implemented as a single multiplication circuit and the third coefficient information meets the following expression (8).

Characteristic (B) 1003 indicated by the solid line indicates the forward characteristic of the AM-PM characteristic stored in the memory 104 to obtain a phase signal equivalent to the phase signal after subjected to AM-PM characteristic compensation using the steady state characteristic 1001 as an input signal to the phase modulation section 11 if the computation processing circuit 107*b* is implemented as a single multiplication circuit and the third coefficient information meets the following expression (9).

$$\text{coeff 3} > 1 \tag{8}$$

$$\text{coeff 3} < 1 \tag{9}$$

The above-mentioned relationship indicates that, for example, it is possible to apply to the compensation if an error occurs between the AM-PM dynamic characteristic of the power amplifier 1 in an amplitude modulation operation state and AM-PM forward characteristic data at the characteristic acquiring time of the power amplifier 1.

Therefore, if the inverse characteristic stored in the memory 104 is not changed, a similar effect to adjusting of the inverse characteristic stored in the memory 104 can be provided by adjusting the third coefficient information.

Figure 12:
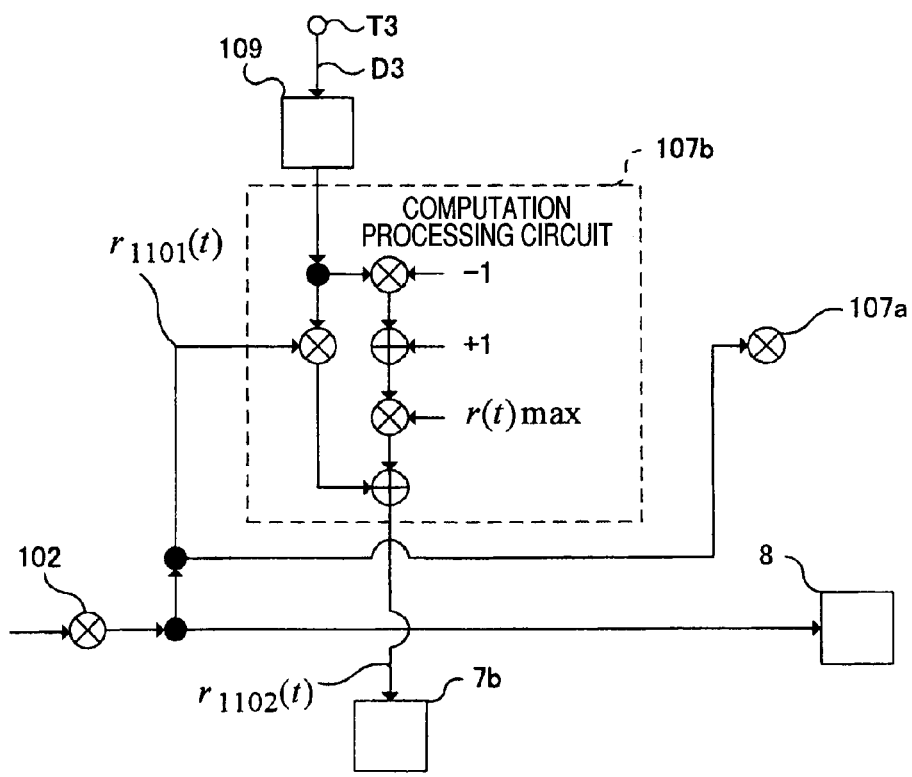
FIG. 12 is a diagram to show an example of a circuit configuration of a computation processing circuit 107b in the first embodiment of the invention.

A similar effect to adjusting of the inverse characteristic stored in the memory 104 can also be provided by adjusting the third coefficient information using a computation circuit shown in FIG. 12.

FIG. 12 shows an example of the circuit configuration of the computation processing circuit 107*b*.

The configuration is adopted, whereby if the amplitude signal output from the multiplication circuit 102 is r1101(t) and the amplitude signal output from the computation processing circuit 107*b* is r1102(t), the relationship between r1101(t) and r1102(t) is shown in the following expression (10):

$$r1102(t) = r1101(t) \times \text{coeff 3} + r(t)\text{max} \times (1 - \text{coeff 3}) \tag{10}$$

Here, r(t)max is the maximum value of the amplitude signal output from the polar conversion section 2 and, for example, is set to 1.

Next, the AM-PM dynamic characteristic compensation method realized by applying the third coefficient information shown in the expressions (8) or (9) mentioned above to the expression (10) mentioned above will be discussed with FIG. 13.

Figure 13:
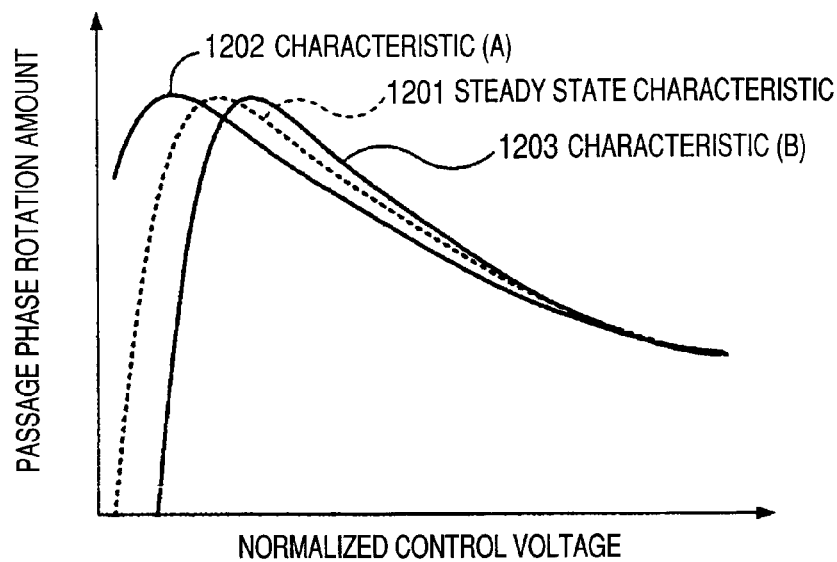
FIG. 13 shows the AM-PM characteristic of the power amplifier.

In FIG. 13, the horizontal axis indicates the normalized control voltage and the vertical axis indicates the passage phase rotation amount of the power amplifier 1.

Steady state characteristic 1201 indicated by the dotted line indicates the steady state characteristic (AM-PM forward characteristic) of the passage phase rotation amount relative to the normalized control voltage and is the same as the steady state characteristic shown in FIG. 4 and the steady state characteristic 1001 shown in FIG. 11.

Characteristic (A) 1202 indicated by the solid line indicates the forward characteristic of the AM-PM characteristic stored in the memory 104 to obtain a phase signal equivalent to the phase signal after subjected to AM-PM characteristic compensation using the steady state characteristic 1201 as an input signal to the phase modulation section 11 if the third coefficient information meets the expression (8) mentioned above.

Characteristic (B) 1203 indicated by the solid line indicates the forward characteristic of the AM-PM characteristic stored in the memory 104 to obtain a phase signal equivalent to the phase signal after subjected to AM-PM characteristic compensation using the steady state characteristic 1201 as an input signal to the phase modulation section 11 if the third coefficient information meets the expression (9) mentioned above.

Subsequently, the AM-PM dynamic characteristic compensation method using the variable attenuation circuit 110 will be discussed with FIGS. 2 and 13.

If the power level of the phase modulation signal output from the variable attenuation circuit 110 is set sufficiently high so that the power amplifier 1 is in a saturation operation state, the attenuation amount of the variable attenuation circuit 110 is finely adjusted, whereby the AM-PM forward characteristic of the power amplifier 1 in a stationary operation state can be changed from the steady state characteristic 1201 to the characteristic (A) 1202 or the characteristic (B) 1203 and even if the inverse characteristic stored in the memory 104 is not changed, a similar effect to adjusting of the inverse characteristic stored in the memory 104 can be provided by adjusting the fourth coefficient information as with the AM-PM dynamic characteristic compensation method using the computation processing circuit 107b and the third coefficient selection section 109.

Although not shown in FIG. 2, if the third coefficient information or the fourth coefficient information output from the third coefficient selection section 109 or the fourth coefficient selection section 111 based on the transmission level information D191 is multiplied by the coefficient information output based on the third address signal D141, higher-accuracy compensation can be realized. The third coefficient selection section 109 or the fourth coefficient selection section 111 may be placed in a format for storing coefficient information corresponding to the third address signal D141 and may output the third coefficient information or the fourth coefficient information based on the third address signal D141.

Figure 14:
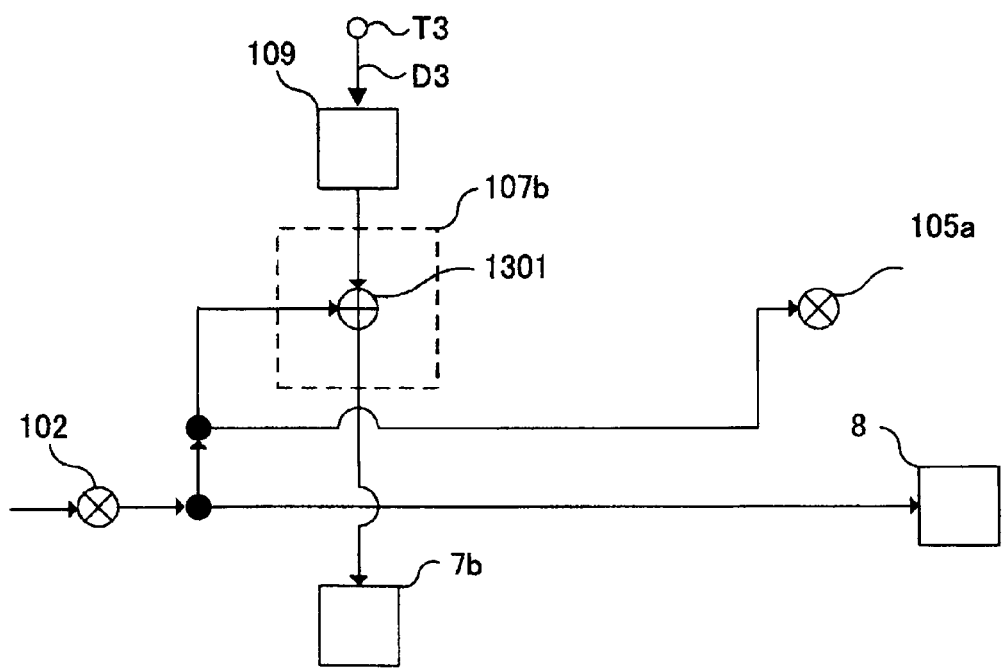
FIG. 14 is a diagram to show another example of the circuit configuration of the computation processing circuit 107b in the first embodiment of the invention.

If the computation processing circuit 107b shown in FIG. 12 is implemented as an addition circuit 1301 shown in FIG. 14 for adding a predetermined value to the amplitude signal output from the multiplication circuit 102, a similar effect to that of the computation processing circuit 107b shown in FIG. 12 can be obtained and the circuit scale can also be further decreased. A similar effect can also be provided by performing the addition processing to the second address signal output from the address generation section 7b rather than the signal input to the address generation section 7b.

(3-4) Compensation Method for Delay Between Paths of Amplitude Signal and Phase Signal Last, the compensation method for the delay between the paths of the amplitude signal and the phase signal using the fifth coefficient selection section 112, the delay adjustment section 4, and the delay adjustment section 5 will be discussed.

Usually, to make synchronous adjustment between the amplitude signal and the phase signal using the delay adjustment section 4 and the delay adjustment section 5, adjustment is made so that a proper differential delay set at the circuit design occurs between the amplitude signal and the phase signal. However, from the examination of the inventors, it was found that the delay between the amplitude modulation signal and the phase modulation signal changes from the proper differential delay in response to the control voltage input to the power amplifier 1, caused by parasitic capacitance involved in the amplitude modulation signal path and the phase modulation signal path of the transistor implementing the power amplifier 1.

Therefore, the fifth coefficient information to adjust the delay between the paths of the amplitude signal and the phase signal based on the fifth coefficient information output from the fifth coefficient selection section 112 based on the transmission level information D191 is transmitted to the delay adjustment section 4 and the delay adjustment section 5 and the delay adjustment section 4 and the delay adjustment section 5 give the delay amount responsive to the fifth coefficient information to the amplitude signal and the phase signal, whereby a better low distortion characteristic can be realized.

Although not described in FIG. 2, the fifth coefficient information output from the fifth coefficient selection section 112 based on the transmission level information D191 is multiplied by coefficient information output based on the third address signal D141 and the product of the coefficient information to adjust the delay between the paths of the amplitude signal and the phase signal based on the third address signal D141 is transmitted to the delay adjustment section 4 and the delay adjustment section 5 and the delay adjustment section 4 and the delay adjustment section 5 give the delay amount responsive to the fifth coefficient information to the amplitude signal and the phase signal, whereby a far better low distortion characteristic can be realized.

(3-5) Summary of Operation of Distortion Compensation Processing Circuit

As described above, as for the AM-AM dynamic characteristic compensation using the AM-AM inverse characteristic in the steady state characteristic stored in the memory 104, the distortion compensation processing circuit 1701 shown in FIG. 2 is responsive to the transmission level information D191 for executing any of multiplying the amplitude signal after subjected to the amplitude correction by the coefficient information representing a transient response, performing predetermined computation processing for the address signal at the referencing time of the AM-AM inverse characteristic in the steady state characteristic stored in the memory 104, performing predetermined computation processing for the address signal at the referencing time of the AM-PM inverse characteristic in the steady state characteristic stored in the memory 104, adjusting the input power level to the power amplifier 1, or making delay adjustment between the paths of the amplitude signal and the phase signal in response to the input control voltage to the power amplifier 1, or executing some in combination, so that it is made possible to precisely compensate for the dynamic characteristic while suppressing an increase in the compensation data in the polar modulation system. Further, compensation using the third address signal D141 is conducted for the compensation responsive to the transmission level information D191, so that the dynamic characteristic compensation effect can be improved and to transmit a signal at high demodulation speed, the compensation effect responsive to the third address signal D141 becomes larger.

That is, distortion compensation processing art in polar modulation circuit of the invention is characterized in that the deterioration factors from the ideal operation involved in the phase modulation and the amplitude modulation are separated into three independent parameters for executing compensation; it is a configuration suited to the multimode operation described later.

Specifically, in FIG. 2, first the AM-AM characteristic and the AM-PM characteristic dependent on the carrier frequency are stored in the memory 104 as compensation data for the deterioration factor involved in the phase modulation.

Next, the coefficient information dependent on the output potential of the power amplifier is stored in the first coefficient selection section 106, the second coefficient selection section 108, the third coefficient selection section 109, the fourth coefficient selection section 111, the fifth coefficient selection section 112, the sixth coefficient selection section 1703 as compensation data for the deterioration factor dependent on the output potential of the power amplifier as for the amplitude modulation.

Further, the coefficient information dependent on the modulation speed is stored in the first coefficient selection section 106, the second coefficient selection section 108, the third coefficient selection section 109, the fifth coefficient selection section 112, the sixth coefficient selection section 1703 as compensation data for the deterioration factor caused by the trackability of the power amplifier to signal change (modulation speed) as for the amplitude modulation.

Each of the compensation effect based on the compensation data stored in the memory 104, the first coefficient selection section 106, the second coefficient selection section 108, the third coefficient selection section 109, the fourth coefficient selection section 111, the fifth coefficient selection section 112, the sixth coefficient selection section 1703 is achieved solely.

(4) Multimode Operation of Polar Modulation Transmitter

Next, the distortion compensation processing operation at the multimode operation time of the polar modulation circuit 1901 shown in FIG. 2 will be discussed.

The maximum value-minimum value ratio (amplitude D-range) of the amplitude signal of the modulation signal used in a radio system is about 17 dB for an 8-PSK modulation signal used in an EDGE system; while, it is about 55 dB for an uplink HPSK modulation signal used in a UMTS system. Therefore, to represent the HPSK modulation signal in output of the power amplifier 1, a wider control range is required than to represent the 8-PSK modulation signal.

The modulation speed of the HPSK modulation signal is 10 times or more higher than that of the 8-PSK modulation signal and to transmit the HPSK modulation signal, the effect of distortion compensation processing responsive to the third address signal D141 based on the amplitude value of the amplitude signal is large as compared with transmission of the 8-PSK modulation signal.

Therefore, to transmit the HPSK modulation signal in the polar modulation transmitter 1900, it is effective to execute the distortion compensation processing responsive to the third address signal D141 based on the amplitude value of the amplitude signal to satisfy the adjacent channel leak power regulation of an output signal for a mobile station transmitter described in UMTS specification "Universal Mobile Telecommunications System (UMTS); User Equipment (UE) radio transmission and reception (FDD) (3GP P TS 25.101 version 6.6.0 Release 6)." On the other hand, the control range required for representing the HPSK modulation signal is wide and a new problem of an increase in the distortion compensation processing data capacity occurs.

Figures 15, 16:
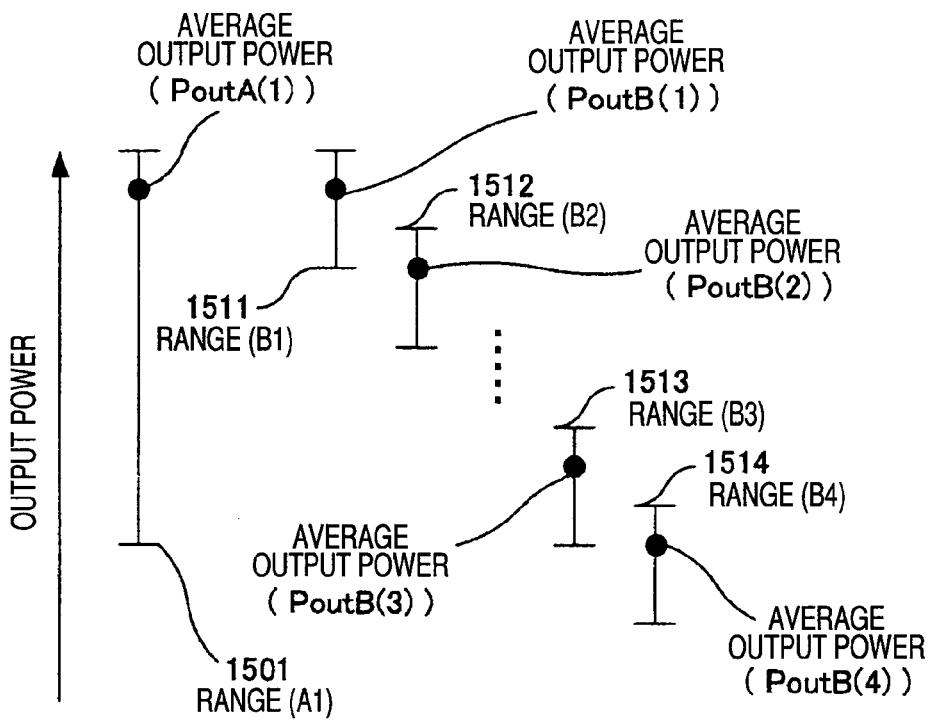
FIG. 15 is a drawing to show D-ranges of instantaneous output power for an HPSK modulation signal and an 8-PSK modulation signal in the output section of the power amplifier 1.
FIG. 16 is a drawing to show an example of table data stored in an address generation section 1402 in the first embodiment of the invention.

Then, the inventors examined method that solves the contrary problems of suppressing an increase in the distortion compensation processing data capacity and ensuring the compensation accuracy at the same time to make it possible for the polar modulation transmitter 1900 to be compatible with the multimode operation, specifically finding the optimum step width of coefficient information by setting coefficient information in transmitting a modulation signal with a wide amplitude D-range based on the optimum value of coefficient information set for each transmission level information at the transmission time of a modulation signal with a comparatively narrow amplitude D-range and therefore this topic will be discussed with FIGS. 1, 2, and 15. In the description to follow, it is assumed that the modulation signal with a comparatively narrow amplitude D-range is 8-PSK modulation signal and the modulation signal with a wide amplitude D-range is HPSK modulation signal.

FIG. 15 is a drawing to show the D-ranges of instantaneous output power for the HPSK modulation signal and the 8-PSK modulation signal in the output section of the power amplifier 1, and the vertical axis indicates output power displayed in dB units.

Range (A1) 1501 is the D-range of instantaneous output power for the HPSK modulation signal when average output power is PoutA(1).

Range (B1) 1511 is the D-range of instantaneous output power for the 8-PSK modulation signal when average output power is PoutB(1).

Range (B2) 1512 is the D-range of instantaneous output power for the 8-PSK modulation signal when average output power is PoutB(2).

Range (B3) 1513 is the D-range of instantaneous output power for the 8-PSK modulation signal when average output power is PoutB(3).

Range (B4) 1514 is the D-range of instantaneous output power for the 8-PSK modulation signal when average output power is PoutB(4).

The relationships among PoutA(1), PoutB(1), PoutB(2), PoutB(3), and PoutB(4) are represented by the following expressions (11) and (12):

$$PoutA(1) = PoutB(1) \tag{11}$$

$$PoutB(n) > PoutB(n+1) \tag{12}$$

The optimum coefficient information for the HPSK modulation signal as the range (A1) 1501 can be found based on the optimum coefficient information for the 8-PSK modulation signal from the range (B1) 1511 to the range (B1) 1514 for executing power control in a predetermined step width.

Therefore, the address generation section 1402 generates the third address signal D141 for the amplitude data D7 output from the amplitude determination section 113 based on the step width of the amplitude signal found from the predetermined step width of the power control and then outputs the signal to the sixth coefficient selection section 1703 through the signal output terminal T141.

FIG. 16 is a drawing to show an example of a generation method of the third address signal D141 for the amplitude data D7 output from the amplitude determination section 113; the first column indicates the amplitude data D7 separated in a predetermined step width and the second column indicates the third address signal D141 output from the address generation section 1402.

To obtain optimum coefficient information for the HPSK modulation signal for further decreasing power from the HPSK modulation signal as the range (A1) 1501, optimum coefficient information for the 8-PSK modulation signal for more decreasing power than the range (B4) 1514 is used.

In the description given so far, the coefficient information for the third address signal D141 based on the amplitude data D7 converted into a discrete value as a predetermined step width is found, but the compensation accuracy can also be further improved by performing interpolation processing based on the coefficient information and the method can also be adopted in a system in which the distortion compensation processing data capacity is allowed.

To implement the radio communication device transmission section using the polar modulation circuit 1901, it is a common practice to place a digital-analog conversion circuit (DAC) not shown between the stages of the first amplitude control section 105 and the amplitude modulation section 10 and between the stages of the phase correction section 9 and the phase modulation section 11 in FIG. 2, but the following configuration can also be adopted:

Using a multiplying DAC (MDAC) for performing multiplication processing of an analog reference signal for a digital input signal, the first amplitude control section 105 is deleted and a signal corresponding to the product of the first coefficient information and the sixth coefficient information output from the multiplication circuit 1702 is input as the reference signal of the MDAC and the digital signal output from the amplitude correction section 8 is input for using the multiplication function of the MDAC. In this case, another DAC may be placed between the stages of the amplitude correction section 8 and the MDAC.

Next, an optimization method of coefficient information in the distortion compensation processing circuit 1701 of the polar modulation transmitter 1900, specifically a setting method of coefficient information using the first memory area of the sixth coefficient selection section will be discussed. In the calibration mode of the sixth coefficient information, the first coefficient information output from the first coefficient selection section 106 is set to "1."

FIG. 17 shows the schematic configuration of the adaptive operation control section 1711 provided in the polar modulation transmitter 1900 shown in FIG. 1. As shown in FIG. 17, the adaptive operation control section 1711 includes a frequency conversion circuit 1712 having a signal input terminal T172, a detection section 1713, and a coefficient control section 1714 having a signal output terminal T173.

The frequency conversion circuit 1712 receives a modulation signal D172 in a radio frequency band output from the power amplifier 1 through a signal output terminal T194 through the signal input terminal T172. The frequency conversion circuit 1712 executes frequency conversion of the modulation signal D172 and decreases the frequency from the radio frequency band to a frequency band that can be processed in the detection circuit 1713.

The detection section 1713 measures signal power (Pow_L, Pow_H) in a lower frequency band and a upper frequency band each as a predetermined identical detune frequency from the center frequency of the modulation signal output from the frequency conversion circuit 1712. It transmits unbalance information ΔPow shown in the following expression (13) to the coefficient control section 1714 based on Pow_L, Pow_H:

$$\Delta Pow = |Pow\_L - Pow\_H| \qquad (13)$$

The coefficient control section 1714 makes a comparison between a threshold value for the unbalance information ΔPow (ΔPow_Thresh), namely, the allowable value of unbalance of adjacent channel leak power (ACPR: Adjacent Channel Power Ratio) characteristic in output of the power amplifier 1 and ΔPow. If the unbalance information ΔPow is less than the threshold value, namely, if the following expression (14) is met, the coefficient control section outputs the control signal D173 for maintaining the coefficient information of the sixth coefficient selection section 1703 to the sixth coefficient selection section 1703 through the signal output terminal T173 and the signal input terminal T171. On the other hand, if the unbalance information ΔPow is equal to or greater than the threshold value, namely, if the following expression (15) is met, the coefficient control section outputs the control signal D173 for switching the coefficient information of the sixth coefficient selection section 1703 to the sixth coefficient selection section 1703 through the signal output terminal T173 and the signal input terminal T174.

$$\Delta Pow < \Delta Pow\_Thresh \qquad (14)$$

$$\Delta Pow \geq \Delta Pow\_Thresh \qquad (15)$$

In the transmission operation mode, the sixth coefficient selection section 1703 outputs sixth coefficient information stored in the second memory area (described later with reference to FIG. 20) using the third address signal D141 output from the address generation section 1402 as the address signal through the signal output terminal T141 and the signal input terminal T171. In the coefficient information calibration mode, the sixth coefficient selection section 1703 outputs "1" in the initial state in the output coefficient information (coeff6) stored in the first memory area shown in FIG. 18. That is, the sixth coefficient selection section 1703 selects the address number Q in the initial state. Then, the sixth coefficient selection section 1703 switches the address number by a predetermined method based on the control signal D173 output from the coefficient control section 1714 through the signal output terminal T173, a signal input terminal T193, and the signal input terminal T174. For example, if the sixth coefficient selection section 1703 receives a control signal for switching the coefficient information as the control signal D173 output from the coefficient control section 1714, it operates so as to select any of the address numbers preceding and following the current selected address number by trial and error.

According to the examination in the process to the invention, it is found that the optimum coefficient information can be selected by measuring the ACPR characteristic in a predetermined band for the modulation signal output from the power amplifier 1 and setting the coefficient information so as to decrease the unbalance of the ACPR characteristic. Therefore, the above-described operation is repeated for each transmission level information or for each transmission level at predetermined intervals with coarser control width than transmission level information using a modulation signal with a comparatively narrow amplitude D-range, whereby the sixth coefficient information optimum for the transmission level with a predetermined control width can be found.

Figure 19:
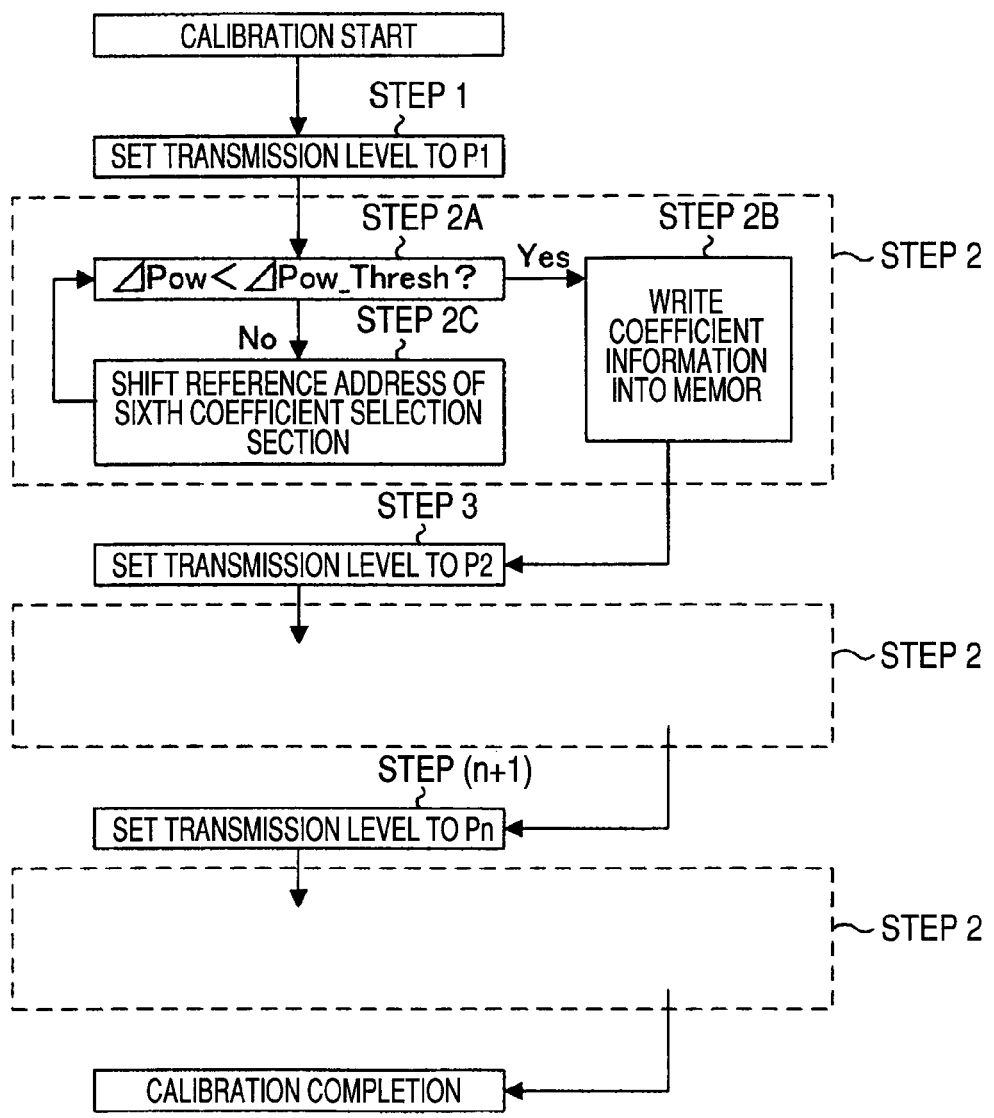
FIG. 19 is a flowchart of calibration in the first embodiment of the invention.

Subsequently, a calibration procedure of the sixth coefficient information for the transmission output level at predetermined intervals will be discussed with FIG. 19. FIG. 19 is a flowchart of calibration. To simplify the description, it is assumed that the amplitude signal r(t) output from the polar conversion section 2 is normalized with 1. That is, the maximum value of the amplitude data D7 is 1.

The distortion compensation processing circuit 1701 and the adaptive operation control section 1711 start the calibration operation with the first mode selection signal output from the control section 1903 as a trigger.

At step 1, after the calibration operation is started, the transmission output level is set to the maximum value P1 of transmission output level regulation.

Subsequently, as step 2, calibration of coefficient information at the output level is performed. At step 2, the coefficient control section 1714 makes a comparison between ΔPow_Thresh and ΔPow (step 2A) and if the condition is met, the coefficient information currently selected in the first memory area forming a part of the sixth coefficient selection section 1703 is written into the second memory area forming a part of the sixth coefficient selection section 1703 (step 2B). At this time, the coefficient information is written into the second memory area in association with the third address signal D141 output from the address generation section 1402 in the transmission operation mode.

For example, if the power control efficient (PCL) output from the transmission level control section 103 is PCLkB to obtain transmission output level Pk, namely, if PCL is PCL1B to obtain transmission output level P1, since the maximum value of the amplitude data D7 is set to 1, the address generation section 1402 is set so as to output "1" as the third address signal D141 for PCL1B*(r(t) maximum value), namely, the amplitude data D7 being PCL1B or more. If the address "1" is input from the address generation section 1402, the optimum value of the sixth coefficient information for PCL1B is stored in the second memory area of the sixth coefficient selection section 1703.

On the other hand, if the comparison result does not meet the condition, an address value different from the address value of the current selected coefficient information is selected according to the procedure already described (step 2C) and again a comparison is made between ΔPow_Thresh and ΔPow (step 2A) and a similar procedure is repeated until the condition is met.

Next, if writing the coefficient information into the second memory area is complete (step 2B), the transmission output level is set to transmission output level P2 for decreasing a first predetermined amount more than the transmission output level P1 (step 3). Subsequently, calibration of coefficient information is executed according to a similar procedure to step 2 executed after step 1. After completion of writing the coefficient information into the second memory area, the transmission output level is set to transmission output level P3 for decreasing the first predetermined amount more than the transmission output level P2 and then a similar operation is repeated. The above-described operation is repeated until the transmission output level with a second predetermined amount decreased from P1 and upon completion of writing the coefficient information into the second memory area, the calibration is complete.

As a result of the above-described calibration operation, the coefficient information is written into the second memory area of the sixth coefficient selection section 1703 in a format shown in FIG. 20. In the address generation section 1402, memory writing is performed so as to execute address generation in a format shown in FIG. 21.

Subsequently, after the termination of the above-described calibration operation, before the calibration mode is switched to the transmission mode, the sixth coefficient information corresponding to the transmission level information D191 for a wide D-range signal is written into the first coefficient selection section 106. Here, in a radio system for which distortion compensation accuracy is not required, the sixth coefficient selection section 1703 may output "1" as the sixth coefficient information regardless of the data D171 input through the signal input terminal T171.

The optimization method of the coefficient information has been described with the coefficient information multiplied in the multiplication circuit 105a taken as an example, but the input signal to the multiplication circuit 1702 is replaced with a signal output from the second, third, fourth, or fifth coefficient selection section 108, 109, 111, or 112 from the signal output from the first coefficient selection section 106, whereby a similar effect can be provided for the second, third, fourth, or fifth coefficient information.

As described above, the sixth coefficient information is found using a signal with a narrow amplitude D-range and is referenced as compensation data at the transmission time of a modulation signal having a wider amplitude D-range, so that it is made possible to solve the contrary problems of suppressing an increase in the distortion compensation processing data capacity and ensuring the compensation accuracy at the same time to make it possible for the polar modulation transmitter to be compatible with the multimode operation.

The polar modulation transmitter 1900 or the polar modulation circuit 1901 described in the first embodiment of the invention can be implemented as an integrated circuit as it is formed on a silicon semiconductor substrate, for example. In this case, the functional blocks can also be formed on separate substrates.

Second Embodiment

A second embodiment of the invention will be discussed about an art of executing calibration of coefficient information as compensation data described in the first embodiment of the invention via a radio link between a mobile station radio communication device and a base station radio communication device.

The calibration art is characterized in that a base station radio communication device includes a detection section of a modulation signal output from a power amplifier forming a part of a mobile station radio communication device and the mobile station radio communication device includes a coefficient control section which updates distortion compensation processing data of the mobile station radio communication device based on the measurement result of the detection section and that the control information amount involved in adaptive operation control is decreased; it can realize adaptive operation control via a radio link.

Figure 22:
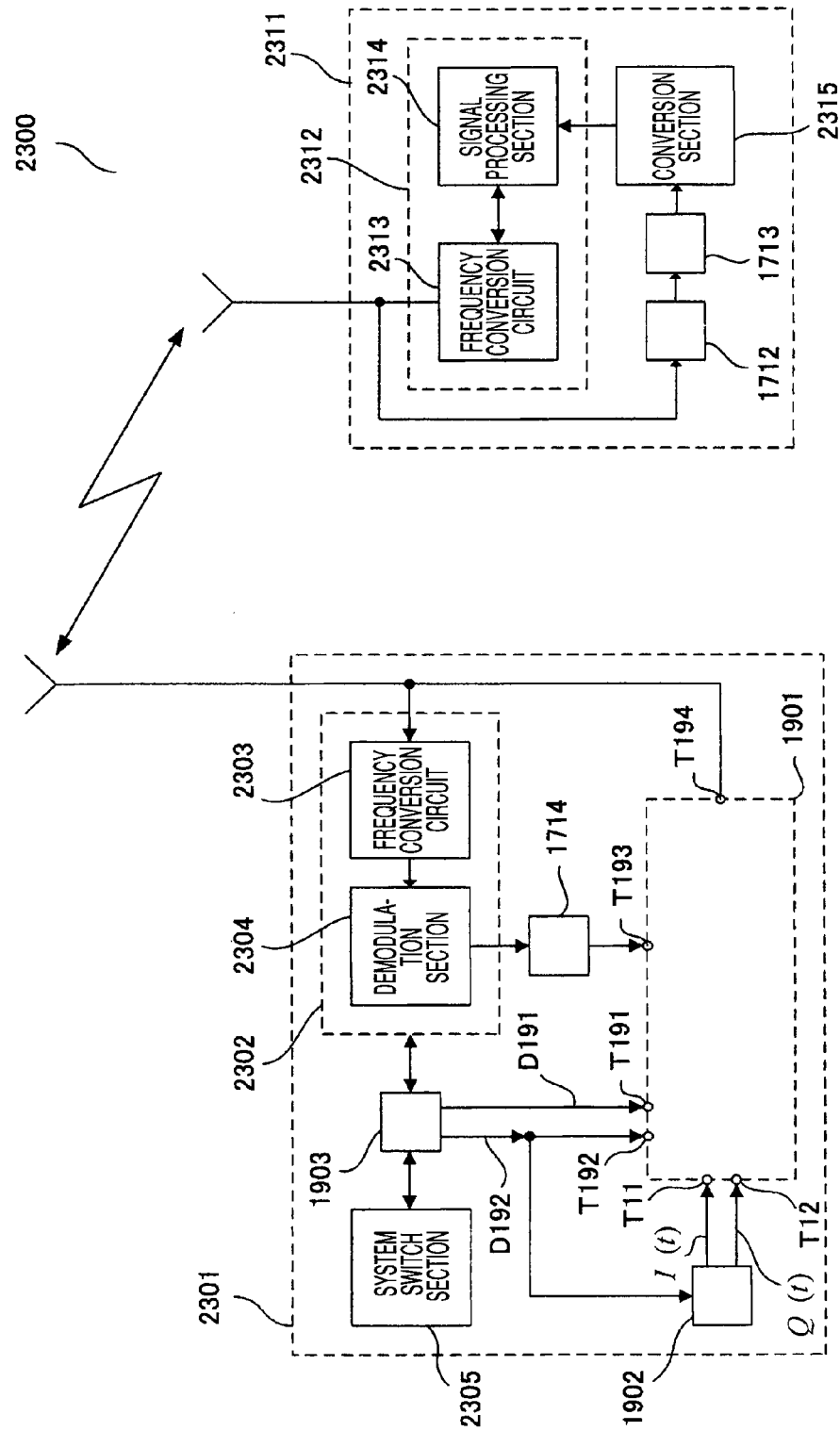
FIG. 22 is a diagram to show a schematic configuration of an adaptive distortion compensation processing system in a second embodiment of the invention.

FIG. 22 is a diagram to show the schematic configuration of an adaptive distortion compensation processing system in the second embodiment of the invention.

As shown in FIG. 22, an adaptive distortion compensation processing system 2300 includes a mobile station radio communication device 2301 and a base station radio communication device 2311, and the mobile station radio communication device 2301 and the base station radio communication device 2311 transmit and receive data to and from each other via a radio link. The mobile station radio communication device 2301 includes a polar modulation circuit 1901, a signal generation section 1902, a control section 1903, a mobile station receiver 2302, and a system switch determination section 2305.

(1) Operation of Mobile Station Radio Communication Device

First, the operation of the mobile station radio communication device 2301 will be discussed.

The signal generation section 1902 generates a baseband quadrature coordinate signal (IQ signal) from transmission data transmitted to the opposed base station radio communication device 2311 based on user operation of the mobile station radio communication device 2301, and outputs the IQ signal to a polar conversion section 2 through signal input terminals T11 and T12.

The control section 1903 performs operation control of the polar modulation circuit 1901 and the mobile station receiver 2302.

The control concerning the mobile station receiver 2302 in the control section 1903 includes automatic gain control, operation control concerning DC offset cancel, etc.

The control concerning the polar modulation circuit 1901 in the control section 1903 is similar to the control described in the first embodiment of the invention and will not be discussed again.

The mobile station receiver 2302 includes a frequency conversion circuit 2303 and a demodulation section 2304.

The frequency conversion circuit 2303 receives a modulation signal transmitted from the base station radio communication device 2311 through an antenna, converts the modulation signal in a radio frequency band into a baseband frequency, and outputs it to the demodulation section 2304.

The demodulation section 2304 reproduces transmission data generated in the base station radio communication device 2311 based on the reception signal output from the frequency conversion circuit 2303. It also outputs unbalance information (ΔPow2) of an out-of-band spectrum of the modulation signal output from the mobile station radio communication device 2301, included in the transmission data and measured in the base station radio communication device 2311 to a coefficient control section 1714. A generation method of the unbalance information (ΔPow2) in base station radio communication device 1811 is described later.

The coefficient control section 1714 makes a comparison between a threshold value for ΔPow2 (ΔPow2_Thresh), namely, the allowable value of unbalance of ACPR characteristic in an output section of a power amplifier 1 forming a part of the polar modulation circuit 1901 and the unbalance information ΔPow2. If the unbalance information ΔPow2 is less than the threshold value, namely, if the following expression (16) is met, the coefficient control section outputs a control signal for maintaining the coefficient information of a sixth coefficient selection section to the sixth coefficient selection section through a signal input terminal T193. On the other hand, if the unbalance information ΔPow2 is equal to or greater than the threshold value, namely, if the following expression (17) is met, the coefficient control section outputs a control signal for switching the coefficient information of the sixth coefficient selection section to the sixth coefficient selection section through the signal input terminal T193:

$$\Delta Pow2 < \Delta Pow2\_Thresh \tag{16}$$

$$\Delta Pow2 \geqq \Delta Pow2\_Thresh \tag{17}$$

As an example of a method of switching the coefficient information of the sixth coefficient selection section if the unbalance information ΔPow2 is equal to or greater than the threshold value, a method of switching by trial and error as shown in the first embodiment of the invention is available, but will not be discussed again.

The system switch section 2305 sets a second mode selection signal D192 output from the control section 1903 before the calibration operation in the polar modulation circuit 1901 is started with a first mode selection signal output from the control section 1903 as a trigger. To control the transmission level between the adjacent time slots during communications in a predetermined mode, the system switch section sets transmission level information D191 output from the control section 1903.

Figure 23:
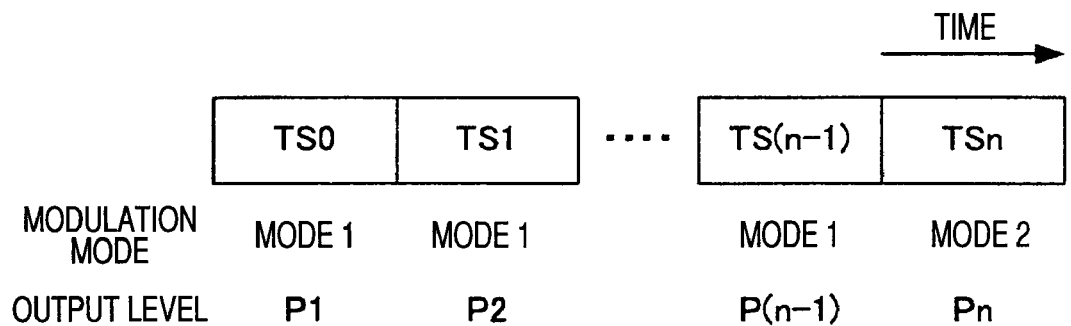
FIG. 23 is a drawing to show time change of the modulation signal output through an antenna from a mobile station radio communication device 2301 in the second embodiment of the invention.

Specifically, as shown in FIG. 23, a modulation signal with the narrowest amplitude D-range is selected among modulation signals with which the mobile station radio communication device 2301 and the base station radio communication device 2311 are compatible after the calibration operation is started. Subsequently, a modulation signal with a wider amplitude D-range is selected in sequence. When the modulation signal with the narrowest amplitude D-range is transmitted, the output level is decreased in sequence.

FIG. 23 is a drawing to show time change of the modulation signal output through an antenna from the mobile station radio communication device 2301 as a result of the control performed by the system switch section 2305.

Time slot TS0 is the first time slot after the calibration start and time slots are consecutive like time slots TS1, TS(n−1), and TSn. The calibration operation time period is up to TS(n−1), and the transmission operation time period is entered in the time slot TSn and the later.

During the calibration operation time period, a modulation signal with a narrow amplitude D-range is used as compared with the modulation mode used in the transmission operation time period and thus mode 1 is a modulation mode with a narrow amplitude D-range as compared with mode 2.

As for output level P1, P2, and P(n−1), the output level P1 is the maximum output level and the output level is lowered in the order of P2 and P(n−1).

The system switch section 2305 performs the operation control described above and the polar modulation circuit 1901 finds the optimum coefficient information as described in the second embodiment of the invention and the calibration operation is complete.

(2) Operation of Base Station Radio Communication Device

Next, the operation of the base station radio communication device 2311 will be discussed.

The base station radio communication device 2311 includes a base station transmission-receiver 2312, a frequency conversion circuit 1712, a detection section 1713, and a conversion section 2315, as shown in FIG. 22. The base station transmission-receiver 2312 includes a frequency conversion circuit 2313 and a signal processing section 2314.

At the reception operation time, the frequency conversion circuit 2313 receives a transmission modulation signal from the mobile station radio communication device 2301 through an antenna, converts a modulation signal in a radio frequency band into a baseband frequency, and outputs it to the signal processing section 2314. At the transmission operation time, the frequency conversion circuit converts a baseband frequency signal output from the signal processing section 2314 into a radio frequency band, and transmits the radio frequency signal to the mobile station radio communication device through the antenna.

At the reception operation time, the signal processing section 2314 reproduces the transmission signal generated in the mobile station radio communication device 2301 from the baseband frequency signal output from the frequency conversion circuit 2313. At the transmission operation time, the signal processing section generates a transmission signal to be transmitted to the opposed mobile station radio communication device 2301 based on a request from the mobile station radio communication device 2301 and a signal output from the conversion section 2315, and outputs baseband frequency signal to the frequency conversion circuit 2313.

The frequency conversion circuit 1712 executes frequency conversion of the radio frequency signal transmitted from the mobile station radio communication device 2301, received through the antenna and decreases the frequency from the radio frequency band to a frequency band that can be processed in the detection section 1713.

The detection section 1713 measures signal power (Pow3_L, Pow3_H) in a lower frequency band and a upper frequency band each as a predetermined identical detune frequency from the center frequency of the modulation signal from the modulation signal output from the frequency conversion circuit 1712 positioned at the preceding stage like the operation of the detection section 1713 shown in FIG. 17. It outputs unbalance information ΔPow3 shown in the following expression (18) to the conversion section 2315 based on Pow3_L, Pow3_H:

$$\Delta Pow3 = Pow3\_L - Pow3\_H \tag{18}$$

The conversion section 2315 converts the unbalance information ΔPow3 output from the detection section 1713 into a discrete value at predetermined intervals, performs bit assignment processing suited to a predetermined transmission signal format to the discrete value, and outputs the bit information (which will be hereinafter called CAL bits) to the signal processing section 2314 as an operation control signal of the adaptive distortion compensation operation of the polar modulation circuit 1901 forming a part of the opposed mobile station radio communication device 2301. The specific processing of the conversion section 2315 is described later.

Next, a generation method of the unbalance information converted into a discrete value in the specific processing of the conversion section 2315 will be discussed. In the description, the case where the step width of the discretization is set to N[dB] is taken as an example.

First, the conversion section 2315 extracts only a quotient K2 of K1 found from the following expression (19) for the unbalance information ΔPow3 output from the detection section 1713. Here, the quotient is K2 and the remainder is K3. Next, the following expression (20) is calculated, whereby unbalance information ΔPow2 discretized in N[dB] step width is found:

$$K1 = \Delta Pow3/N = K2 + K3 \quad (19)$$

$$\Delta Pow2 = (K2-1)*N \quad (20)$$

Next, the bit assignment processing suited to the predetermined transmission signal format to the unbalance information ΔPow2 will be discussed.

Figure 24:
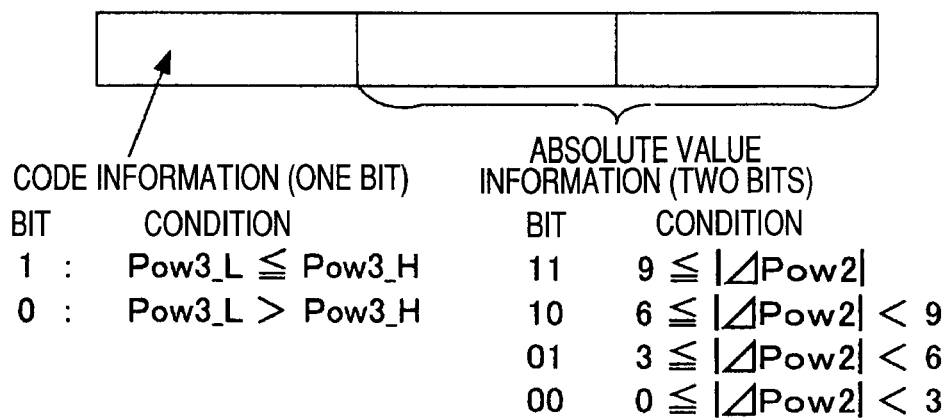
FIG. 24 is a drawing to show an example of CAL bits in the second embodiment of the invention.

FIG. 24 shows an example of generating the CAL bits from the unbalance information ΔPow2 discretized in N=3, namely, 3 [dB] step width.

In this example, two bits are assigned to the absolute value information of the unbalance information ΔPow2 and one bit is assigned to the code information of the unbalance information ΔPow2. That is, the three bits represent the unbalance information. The number of bits that can be assigned varies from one assumed radio system to another.

The system is configured as described above, whereby it is made possible to feed back the ACPR characteristic acquisition result of the output spectrum of the power amplifier 1 in the base station radio communication device 2311 into the polar modulation circuit 1901 forming a part of the mobile station radio communication device 2301 through a radio link. Accordingly, a new problem of shortening of the talk time and the data communication time of the mobile station radio communication device caused by the loss by branching the output signal of the power amplifier 1 and an increase in the consumption current in the section for acquiring the ACPR characteristic, occurring in the second embodiment wherein the mobile station radio communication device incorporates the frequency conversion circuit 1712 and the detection section 1713 can be solved.

Third Embodiment

A third embodiment of the invention will be discussed about an art of realizing predistortion processing of a multimode radio transmitter while suppressing an increase in the distortion compensation processing data capacity and an increase in the circuit scale of a distortion compensation processing circuit.

The multimode predistortion processing art will be discussed using a polar modulation circuit shown in FIG. 25. Parts identical with the polar modulation circuit shown in FIG. 2 are denoted by the same reference numerals.

Figure 25:
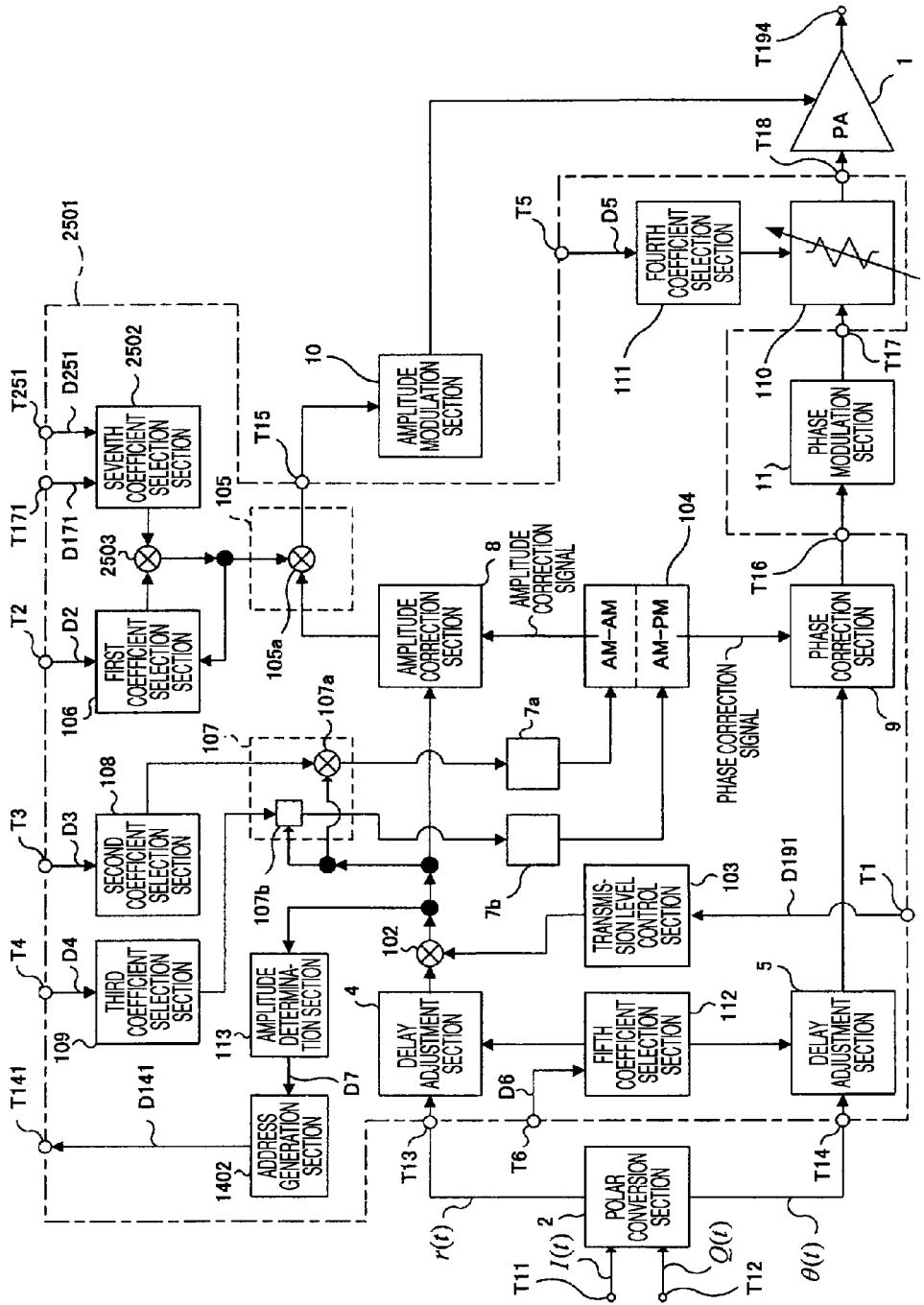
FIG. 25 is a diagram to show an example of a distortion compensation processing circuit forming a part of a polar modulation transmitter in a third embodiment of the invention.

As shown in FIG. 25, a distortion compensation processing circuit 2501 includes a seventh coefficient selection section 2502 having a signal input terminal T251 and a multiplication circuit 2503 in place of the sixth coefficient selection section 1703 and the multiplication circuit 1702 in the polar modulation circuit 1901 shown in FIG. 2. The multiplication circuit 2503 multiplies first coefficient information output from a first coefficient selection section 106 by seventh coefficient information (coeff7) output from the seventh coefficient selection section 2502.

A mode selection signal D192 is input to a signal input terminal T251 from a control section 1903 shown in FIG. 1. In the embodiment, a second mode selection signal for setting a signal modulation mode in the mode selection signal D192 contains modulation speed data D251 as information for identifying the type of modulation signal transmitted at present.

The seventh coefficient selection section 2502 stores the seventh coefficient information (coeff7) in a format shown in FIG. 26. The first column of table data shown in FIG. 26 indicates the address number of the table data and the second column indicates the seventh coefficient information in a predetermined range containing 1. In this example, coefficient information 1 is stored in address number 3 and each coefficient information is set so that it is monotonously decreased with an increase in the address number in such a manner that the coefficient information corresponding to the address number smaller than 3 is set larger than "1" and the coefficient information corresponding to the address number larger than 3 is set smaller than "1," for example.

Figures 27, 28:
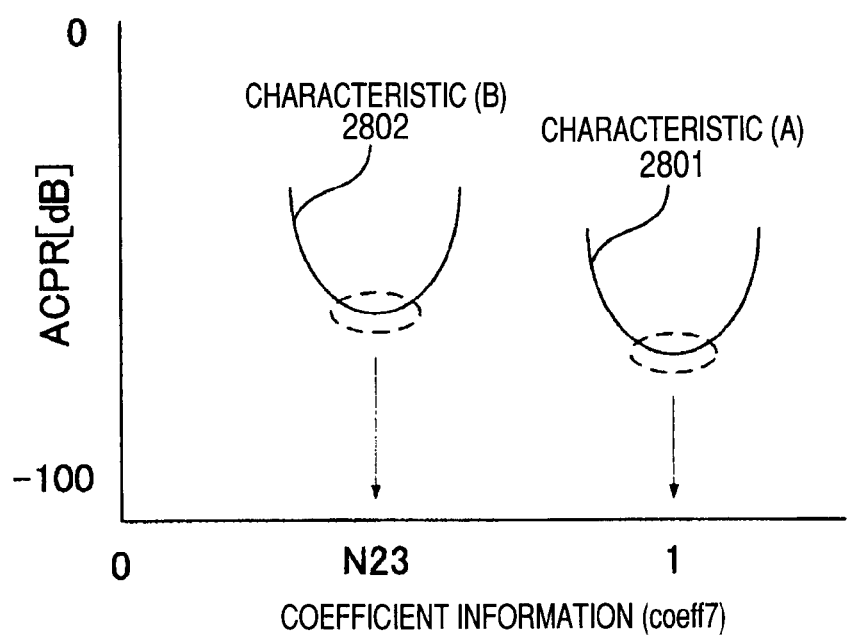
FIG. 27 is a drawing to show the relationship between modulation speed and modulation speed information D251.
FIG. 28 is a drawing to show the relationship between modulation speed and seventh coefficient information.

The seventh coefficient selection section 2602 stores table data associating the modulation speed data D251 separated for each predetermined range and the address number, as shown in FIG. 27. Upon reception of the modulation speed data D251 through the signal input terminal T251, the seventh coefficient selection section references the address number associated with the modulation speed data D251 and selects the seventh coefficient information. The first column of the table data shown in FIG. 27 indicates the range of the modulation speed and the second column indicates the address number when the data stored in the seventh coefficient selection section 2502 shown in FIG. 26 is referenced. It is assumed that the first coefficient selection section 106 selects address number M input to a signal input terminal T2 based on transmission level information D191 as shown in the first embodiment of the invention.

According to the examination in the process to the invention, it was found that if data D3 to data D6 input to signal input terminals T3 to T6 are based on the same information in addition to data D2 input to the signal input terminal T2, the seventh coefficient information (coeff7) to obtain the optimum point of the ACPR characteristic of the modulation signal output from the power amplifier 1 becomes a smaller value if the modulation speed increases.

FIG. 28 is a drawing to show the ACPR characteristics for the modulation signals having different modulation speed. In FIG. 28, the horizontal axis indicates the seventh coefficient information and the vertical axis indicates the ACPR value.

Characteristic (A) 2901 is an ACPR characteristic acquired by sweeping only the seventh coefficient information when an 8-PSK modulation signal for an EDGE system is used.

Characteristic (B) 2902 is an ACPR characteristic acquired by sweeping only the seventh coefficient information when a modulation signal for a WCDMA system, for example, is used as a higher-speed modulation signal than the 8-PSK modulation signal.

The ACPR characteristics shown in FIG. 28 are provided by extracting the worse characteristics of the ACPR characteristics in a lower frequency band and a upper frequency band.

In the third embodiment of the invention, the seventh coefficient information when the 8-PSK modulation signal for the EDGE system is used is considered as the reference and thus to transmit at the modulation speed of the 8-PSK modulation signal (about 270 k), the table data in FIGS. 26 and 27 is set so as to output the seventh coefficient information of "1" corresponding to modulation speed D7, but the definition method of stored data in the table data should be changed according to the assumed multimode signal, the required compensation accuracy, etc., needless to say.

As described above, since the optimum value of the seventh coefficient information varies depending on the modulation speed, the seventh coefficient information is switched based on the information representing the modulation speed in the polar modulation transmitter according to the third embodiment of the invention.

The system is configured as described above, whereby the equivalent effect to providing distortion compensation processing data of the power amplifier 1 stored in memory 102 for each modulation signal is realized and predistortion processing of a multimode radio transmitter can be realized while suppressing an increase in the distortion compensation processing data capacity and an increase in the circuit scale of the distortion compensation processing circuit.

The sixth coefficient selection section 1703 having the signal input terminals T171 and T174, the multiplication circuit 1702, and the adaptive operation control section 1711 shown in FIG. 2 are added to the distortion compensation processing circuit 2501, the multiplication circuit 1702 multiplies the product of the first coefficient information and the seventh coefficient information output from the multiplication circuit 2503 by the sixth coefficient information (coeff6) output from the sixth coefficient selection section 1703, the data D141 output from the address generation section 1402 through the signal output terminal T141 is input to the sixth coefficient selection section 1602 through the signal input terminal T171, and the data D173 output from the coefficient adjustment determination section 1714 is input to the sixth coefficient selection section 1602 through the signal output terminal T173 and the signal input terminal T174, whereby a polar modulation transmitter that can realize adaptive distortion compensation processing can be realized.

The polar modulation transmitter according to the third embodiment of the invention can be implemented as an integrated circuit as it is formed on a silicon semiconductor substrate, for example. In this case, the functional blocks can also be formed on separate substrates.

Fourth Embodiment

A fourth embodiment of the invention will be discussed about a predistortion processing art that can be applied to a cognitive radio communication device for autonomously selecting the frequency and modulation system used for radio communications in response to the ambient radio wave environment.

The distortion compensation processing art in a polar modulation circuit of the invention is characterized in that the deterioration factors from the ideal operation involved in the phase modulation and the amplitude modulation are separated into three independent parameters for executing compensation. An example of applying the distortion compensation processing art to a cognitive radio communication device will be discussed.

Figure 30:
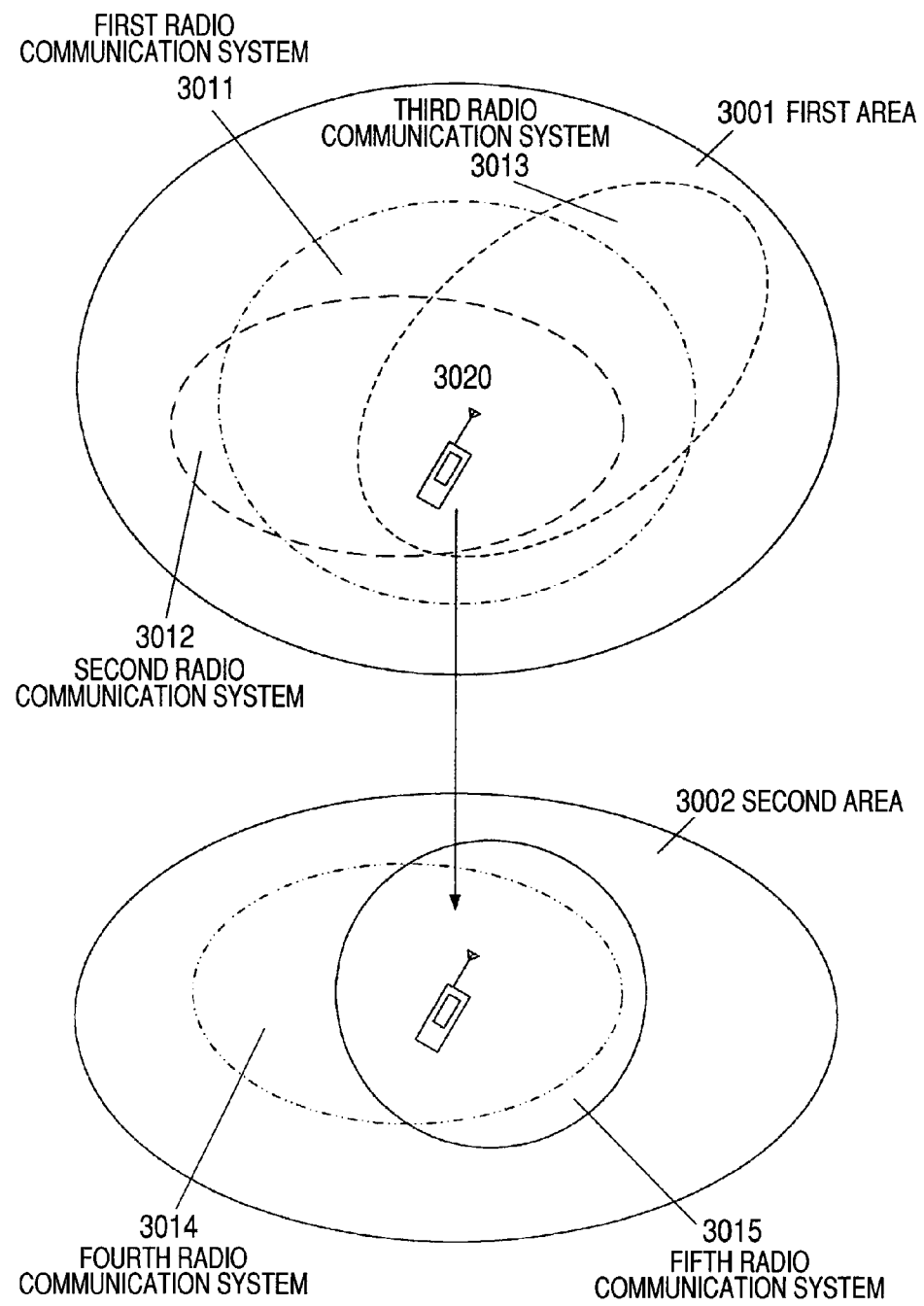
FIG. 30 is a diagram to show a schematic configuration of a cognitive radio communication system in a fourth embodiment of the invention.

FIG. 30 is a diagram to show the schematic configuration of a cognitive radio communication system.

In FIG. 30, a first area 3001 and a second area 3002 indicate two geographically different areas, a first radio communication system 3011, a second radio communication system 3012, and a third radio communication system 3013 indicate radio communication systems for providing service in the first area 3001, a fourth radio communication system 3014 and a fifth radio communication system 3015 indicate radio communication systems for providing service in the second area 3002, and a radio communication device 3020 indicates a cognitive radio communication device compatible with the radio communication systems in the first area 3001 and the second area 3002.

FIG. 31 is a drawing to show an example of representative parameters in the radio communication systems shown in FIG. 30.

In the description in the fourth embodiment of the invention, the first radio communication system 3011 involves parameters of frequency band f1, modulation system 8-PSK, and modulation speed SP1, the second radio communication system 3012 involves parameters of frequency band f2, modulation system QPSK, and modulation speed SP2, the third radio communication system 3013 involves parameters of frequency band f3, modulation system HPSK, and modulation speed SP3, the fourth radio communication system 3014 involves parameters of frequency band f3, modulation system 8-PSK, and modulation speed SP4, and the fifth radio communication system 3015 involves parameters of frequency band f1, modulation system OFDM, and modulation speed SP5, but the invention is not limited to the example.

It is assumed that the radio communication device 3020 is used in the first area 3001 at the manufacturing time and if the user of the radio communication device 3020 moves in the first area 3001, the radio communication device 3020 is switched among the first radio communication system 3011, the second radio communication system 3012, and the third radio communication system 3013 for use. It is assumed that the switching is performed based on the electric field strength, the effective transmission speed, the charging system, etc. It is assumed that the component of a transmission section of the radio communication device 3020 is the polar modulation circuit 1901 shown in FIG. 2 or a part thereof.

If the user of the radio communication device 3020 leaves the first area 3001 and enters the second area 3002, the radio communication device 3020 measures the ambient radio wave environment and detects the presence of the fourth radio communication system 3014, the fifth radio communication system 3015 not assumed at the manufacturing time.

Before staring the transmission operation compatible with the fourth radio communication system 3014 and the fifth radio communication system 3015, as distortion compensation processing data, the radio communication device 3020 acquires the coefficient information corresponding to the dynamic range of modulation signal according to the procedure described with FIG. 19 of the first embodiment of the invention and also acquires the coefficient information corresponding to the modulation speed as described in the third embodiment of the invention. The coefficient information may be acquired via the radio link between the mobile station radio communication device and the base station radio communication device as described in the second embodiment of the invention.

The distortion compensation processing data corresponding to the frequency is stored in the memory 104 shown in FIG. 2 at the manufacturing time as for the frequency band assumed to be used, but before the transmission operation is started, the AM-AM characteristic and the AM-PM characteristic for each frequency may be acquired in a state in which the distortion compensation processing data corresponding to the dynamic range of modulation signal or the modulation speed is set to a fixed value.

As described above, since the compensation data dependent on the carrier frequency, the compensation data dependent on the output potential of the power amplifier, and the compensation data dependent on the modulation speed are stored independently, the distortion compensation processing art in the polar modulation circuit of the invention can be flexibly compatible with the frequency, the modulation system, and the modulation speed varying from one radio communication system to another and if large-capacity memory is not provided for distortion compensation processing data, the distortion compensation processing art can also be compatible with a radio communication system not assumed at the manufacturing time of the radio communication device.

While the invention has been described in detail with reference to the specific embodiments, it will be obvious to those skilled in the art that various changes and modifications can be made without departing from the spirit and the scope of the invention.

This application is based on Japanese Patent Application (No. 2005-375485) filed on Dec. 27, 2005, which is incorporated herein by reference.

INDUSTRIAL APPLICABILITY

The polar modulation transmitter of the invention has the advantage that it makes it possible to realize the low distortion characteristic of the power amplifier at the amplitude modulation operation time while suppressing an increase in the distortion compensation processing data capacity and an increase in the circuit scale of the distortion compensation processing circuit, and it is useful for a multimode polar modulation transmitter, an adaptive distortion compensation processing system, and etc.

The invention claimed is:

1. A multimode polar modulation transmitter, comprising:
    a first control section which selects a modulation system of a transmission modulation signal;
    a signal generation section which generates a baseband quadrature signal according to the modulation system selected by the first control section based on transmission data;
    a polar conversion section which generates an amplitude signal from the baseband quadrature signal;
    an amplitude modulation section which generates an amplitude modulation signal based on the amplitude signal;
    a phase modulation section which generates a phase modulation signal in a radio frequency band based on a signal containing at least a phase component of the baseband quadrature signal;
    an amplification section which generates transmission data in the radio frequency band, the amplification section in which the phase modulation signal is input as an input high frequency signal and the amplitude modulation signal is input as a control signal;
    a distortion compensation processing circuit which performs predetermined distortion compensation processing for at least one of the input signal to the amplitude modulation section and the input signal to the phase modulation section; and
    a second control section which switches between calibration operation of compensation data used in said distortion compensation processing circuit and transmission operation,
    wherein at the calibration operation time, the first control section selects a modulation system in which an amplitude dynamic range becomes equal to or less than an amplitude dynamic range of a modulation signal in the modulation system used at the transmission operation time.

2. The multimode polar modulation transmitter as claimed in claim 1, wherein
    the first control section further decreases the output level monotonously in a predetermined control width at the calibration operation time.

3. The multimode polar modulation transmitter as claimed in claim 1, wherein
    the distortion compensation processing circuit includes a steady state characteristic compensation circuit which linearizes an output signal in a steady state of the amplification section based on the output signal characteristic relative to the control voltage value in the steady state of the amplification section to which an input high frequency signal of a predetermined amplitude and a control voltage are input.

4. The multimode polar modulation transmitter as claimed in claim 3, wherein
    the distortion compensation processing circuit further includes a first amplitude control section which adjusts the amplitude of the amplitude signal after execution of the linearizing processing of the output signal in the steady state in the steady state characteristic compensation circuit.

5. The multimode polar modulation transmitter as claimed in claim 3, wherein
    the distortion compensation processing circuit further includes a second amplitude control section which adjusts the amplitude of an amplitude signal for address reference when distortion compensation processing of the amplitude signal is performed in the steady state characteristic compensation circuit.

6. The multimode polar modulation transmitter as claimed in claim 3, wherein
    the distortion compensation processing circuit further includes a first phase compensation section which adjusts the amplitude of an amplitude signal for address reference when distortion compensation processing of the phase signal is performed in the steady state characteristic compensation circuit.

7. The multimode polar modulation transmitter as claimed in claim 3, wherein
    the distortion compensation processing circuit further includes a second phase compensation section which adjusts the amplitude of the phase signal or the phase modulation signal.

8. The multimode polar modulation transmitter as claimed in claim 3, wherein
    the distortion compensation processing circuit further includes a delay adjustment section which gives a predetermined delay amount to the amplitude signal or the phase signal and ensures synchronization between the amplitude signal and the phase signal.

9. An integrated circuit installing a multimode polar modulation transmitter as claimed in claim 1.

10. A radio communication device, comprising the integrated circuit as claimed in claim 9.

11. A radio communication system, comprising the integrated circuit as claimed in claim 9.

12. A radio communication device, comprising the multimode polar modulation transmitter as claimed in claim 1.

13. A radio communication system, comprising the radio communication device as claimed in claim 12.

14. A radio communication system, comprising the multimode polar modulation transmitter as claimed in claim 1.

15. A multimode polar modulation transmission method, comprising the steps of:
    selecting a modulation system of a transmission modulation signal;
    generating a baseband quadrature signal according to the selected modulation system based on transmission data;
    generating an amplitude signal from the baseband quadrature signal;

generating an amplitude modulation signal based on the amplitude signal;

generating a phase modulation signal in a radio frequency band based on a signal containing at least a phase component of the baseband quadrature signal;

inputting the phase modulation signal as an input high frequency signal, inputting the amplitude modulation signal as a control signal, and generating transmission data in the radio frequency band; and switching between calibration operation of compensation data used in a distortion compensation processing circuit which performs predetermined distortion compensation processing for at least one of the input signal to the amplitude modulation section and the input signal to the phase modulation section and transmission operation, wherein at the calibration operation time, a modulation system wherein an amplitude dynamic range of a modulation signal becomes equal to or less than an amplitude dynamic range of a modulation signal in the modulation system used at the transmission operation time is selected.

16. A multimode radio communication method for conducting radio communications between a base station and a mobile station using the multimode polar modulation transmission method as claimed in claim 15.

* * * * *